(12) United States Patent
Song et al.

(10) Patent No.: US 12,519,007 B2
(45) Date of Patent: Jan. 6, 2026

(54) SUPPORT UNIT AND SUBSTRATE TREATING APPARATUS

(71) Applicant: SEMES CO., LTD., Cheonan-si (KR)

(72) Inventors: Soo Han Song, Goyang-si (KR); Chul Goo Kim, Sejong-si (KR); Jung Bong Choi, Suwon-si (KR); Kang Seop Yun, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 699 days.

(21) Appl. No.: 17/704,194

(22) Filed: Mar. 25, 2022

(65) Prior Publication Data

US 2022/0319905 A1    Oct. 6, 2022

(30) Foreign Application Priority Data

Apr. 1, 2021   (KR) .................. 10-2021-0042577

(51) Int. Cl.
*H01L 21/687* (2006.01)
*B05C 9/14* (2006.01)
*B05C 11/02* (2006.01)
*H01L 21/67* (2006.01)

(52) U.S. Cl.
CPC .......... *H01L 21/68785* (2013.01); *B05C 9/14* (2013.01); *B05C 11/02* (2013.01); *H01L 21/67103* (2013.01); *H01L 21/67109* (2013.01); *H01L 21/67115* (2013.01); *H01L 21/67248* (2013.01)

(58) Field of Classification Search
USPC ........... 118/52, 612, 58, 712, 666, 667, 318, 319, 118/641–643, 500, 69
See application file for complete search history.

(56) References Cited

U.S. PATENT DOCUMENTS

| | | | |
|---|---|---|---|
| 5,372,652 A | * | 12/1994 | Srikrishnan ....... H01L 21/67028 134/21 |
| 5,591,269 A | * | 1/1997 | Arami ................... C23C 16/463 118/500 |
| 9,748,118 B2 | | 8/2017 | Kim et al. |
| 11,510,284 B2 | | 11/2022 | Morita et al. |

(Continued)

FOREIGN PATENT DOCUMENTS

| | | |
|---|---|---|
| CN | 104347382 A | 2/2015 |
| CN | 110957243 A | 4/2020 |

(Continued)

OTHER PUBLICATIONS

English Translation KR-2006080029 (Year: 2006).*

(Continued)

*Primary Examiner* — Yewebdar T Tadesse
(74) *Attorney, Agent, or Firm* — Harness, Dickey & Pierce, P.L.C.

(57) ABSTRACT

Disclosed is a support unit. The support unit that supports a substrate may include a chuck stage that is rotatable, a heating member disposed above the chuck stage and that heats the substrate supported by the support unit, a power source that applies electric power to the heating member, a window disposed above the chuck stage and defining an interior space, in which the heating member is disposed, and an interlock module that selectively cuts off the electric power applied to the heating member.

16 Claims, 12 Drawing Sheets

(56) References Cited

U.S. PATENT DOCUMENTS

| | | | | |
|---|---|---|---|---|
| 2010/0243606 | A1* | 9/2010 | Koshimizu | H01J 37/32091 156/345.44 |
| 2015/0034133 | A1* | 2/2015 | Kim | H01L 21/67051 134/105 |
| 2019/0103256 | A1* | 4/2019 | Liao | H01L 21/3065 |
| 2021/0050235 | A1 | 2/2021 | Yun et al. | |

FOREIGN PATENT DOCUMENTS

| | | |
|---|---|---|
| JP | H07302778 A | 11/1995 |
| JP | 2005-310940 A | 11/2005 |
| JP | 2007-288101 A | 11/2007 |
| JP | 2014-042027 A | 3/2014 |
| JP | 2020-056095 A | 4/2020 |
| JP | 6837481 B2 * | 3/2021 ......... G03F 7/70716 |
| KR | 2005-0072598 A | 7/2005 |
| KR | 20060080029 A * | 7/2006 |
| KR | 10-2020-0035882 A | 4/2020 |
| KR | 10-2020-0060702 A | 6/2020 |
| KR | 10-2020-0074307 A | 6/2020 |

OTHER PUBLICATIONS

English Translation JP-6837481B1 (Year: 2021).*
Japanese Office Action dated May 2, 2023 issued in corresponding Japanese Appln. No. 2022-060781.
Korean Office Action dated Feb. 13, 2023 issued in corresponding Korean Appln. No. 10-2021-0042577.
Korean Office Action dated Oct. 30, 2023 for corresponding Korean Patent Application No. 10-2021-0042577.
Chinese Office Action issued in corresponding Chinese Patent Application 202210348945.7, dated Jul. 26, 2025.

* cited by examiner

SUPPORT UNIT AND SUBSTRATE TREATING APPARATUS

CROSS-REFERENCE TO RELATED APPLICATIONS

A claim for priority under 35 U.S.C. § 119 is made to Korean Patent Application No. 10-2021-0042577 filed on Apr. 1, 2021, in the Korean Intellectual Property Office, the entire contents of which are hereby incorporated by reference.

BACKGROUND

Embodiments of the inventive concept described herein relate to a support unit and a substrate treating apparatus.

In general, in processes of manufacturing flat panel display devices or semiconductors, a process of treating a glass substrate or a wafer includes various processes such as a photoresist coating process, a developing process, an etching process, and an ashing process. The processes include a wet cleaning process using chemicals or deionized water and a drying process for drying the chemicals or the deionized water that is left on a surface of a substrate, in order to remove various contaminants attached to the substrate. Furthermore, in recent years, a treatment process (for example, an etching process) of selectively removing a silicon nitride film and a silicon oxide film has been performed by using chemicals such as sulfuric acid or phosphoric acid.

As a substrate treating apparatus using a chemical, a substrate treating apparatus that heats a substrate has been used to improve substrate treatment efficiency. An example of the above-described substrate treating apparatus is disclosed in U.S. Patent Application Publication No. 2016-0013079. According to the above patent, a substrate treating apparatus has a lamp that heats a substrate in a spin head. The lamp generates radiation heat that heats the substrate. When the heat radiated by the lamp is delivered to the substrate, a temperature of the substrate increases. Accordingly, substrate treatment efficiency increases.

However, due to an abnormal operation of the lamp or a breakdown of a component that operates the lamp, a temperature of a space, in which the lamp is disposed, may increase excessively. In this case, an explosion may occur in the spin head. Furthermore, heat may be delivered to a driver of the spin had, and thus the driver may break down.

SUMMARY

Embodiments of the inventive concept provide a support unit that may detect an abnormal operation of a heating member that heats a substrate or a breakdown of a component that operates the heating member, and a substrate treating apparatus.

Embodiments of the inventive concept also provide a support unit that may detect overheating of a temperature of a space, in which a heating member is disposed, and a substrate treating apparatus.

Embodiments of the inventive concept also provide a support unit that may improve a danger of explosion by heat generated by a heating member and/or a danger of breakdown of a spin driving part, and a substrate treating apparatus.

The aspect of the inventive concept is not limited thereto, and other unmentioned aspects of the present invention may be clearly appreciated by those skilled in the art from the following descriptions.

According to an embodiment, a support unit that supports a substrate may include a chuck stage that is rotatable, a heating member disposed above the chuck stage and that heats the substrate supported by the support unit, a power source that applies electric power to the heating member, a window disposed above the chuck stage and defining an interior space, in which the heating member is disposed, and an interlock module that selectively cuts off the electric power applied to the heating member.

According to an embodiment, the support unit may further include a controller, the interlock module may include a temperature sensor that measures a temperature of the interior space and deliver the measured temperature of the interior space to the controller, and the controller may generate a control signal for cutting off the electric power applied to the heating member when the temperature of the interior space, which is delivered from the temperature sensor, is higher than a preset temperature.

According to an embodiment, the interlock module may include a cutoff member that cuts off the electric power delivered from the power source to the heating member by opening a closed circuit provided by the power source and the heating member according to a change in a temperature of the interior space.

According to an embodiment, the cutoff member may include a first cutoff member, and a second cutoff member connected to the first cutoff member in series, and having a power cutoff structure that is different from that of the first cutoff member.

According to an embodiment, the first cutoff member may include a fuse, and the second cutoff member may include a bimetal.

According to an embodiment, the support unit may include a reflection plate disposed below the heating member, a cooling plate disposed below the reflection plate, and a support member disposed to overlap an opening formed in the reflection plate when viewed from a top, and disposed above the cooling plate, and the cutoff member may be installed in the support member.

According to an embodiment, the support unit may further include a plate disposed below the heating member, and a terminal member inserted into an opening formed in the plate, and connected to a power source line that delivers the electric power to the heating member, and the heating member may have a hook shape, and one end and an opposite end of the heating member are connected to the terminal member.

According to an embodiment, the support unit may further include a spin driving part coupled to the chuck stage to rotate the chuck stage, and having a hollow, and a body inserted into the hollow of the spin driving part, and the plate may be coupled to the body to be independent from rotation of the chuck stage.

According to an embodiment, a plurality of heating members may be provided, and the heating members may surround the body when viewed from a top.

According to an embodiment, a substrate treating apparatus may include a chamber having an interior space, a support unit that supports and rotates a substrate in the interior space, a fluid supply unit supported by the support unit and that supplies a treatment fluid to the rotating substrate, a bowl having a treatment space for treating the substrate supported by the support unit, and a controller, the support unit may include a chuck stage coupled to a spin driving part having a hollow, a heating member disposed above the chuck stage and that heats the substrate supported by the support unit, a power source that applies electric power to the heating member, a window disposed above the chuck stage and defining an interior space, in which the heating member is disposed, and an interlock module that cuts off the electric power delivered to the heating member when a temperature of the interior space is higher than a preset temperature, and the interlock module may include a temperature sensor that measures the temperature of the interior space and deliver the measured temperature of the interior space to the controller, or a cutoff member that cuts off the electric power delivered from the power source to the heating member by opening a closed circuit provided by the power source and the heating member according to a change in the temperature of the interior space.

According to an embodiment, the controller may generate a control signal for cutting off the electric power applied to the heating member when the temperature of the interior space, which is delivered from the temperature sensor, is higher than the preset temperature.

According to an embodiment, the support unit may further include a nozzle body inserted into the hollow of the spin driving part, a reflection plate coupled to the nozzle body and disposed below the heating member, a cooling plate disposed below the reflection plate, and a support member inserted into an opening formed in the reflection plate, and disposed above the cooling plate, and the cutoff member may be installed in the support member.

According to an embodiment, the cutoff member may include a first cutoff member, and a second cutoff member having a power cutoff structure that is different from that of the first cutoff member.

According to an embodiment, the first cutoff member may include a fuse, and the second cutoff member may include a bimetal.

According to an embodiment, the substrate treating apparatus may further include a terminal member inserted into the opening, and connected to a power source line that delivers the electric power to the heating member, and the heating member may have a hook shape, and one end and an opposite end of the heating member are connected to the terminal member.

According to an embodiment, a plurality of heating members may be provided, and the heating members may surround the nozzle body when viewed from a top.

According to an embodiment, the heating members may be fixedly installed above the reflection plate to be independent from rotation of the chuck stage.

According to an embodiment, a support unit that supports a substrate may include a chuck stage coupled to a spin driving part having a hollow, a back nozzle part that supplies a treatment fluid to a rear surface of the substrate supported by the support unit, a plurality of IR lamps disposed above the chuck stage and that heats the substrate supported by the support unit, a power source that applies electric power to the IR lamps, a window disposed above the chuck stage, defining an interior space, in which the IR lamps are disposed, and having at least one discharge hole on a side surface thereof, a reflection plate disposed below the IR lamps, a cooling plate having a cooling passage, in which a cooling fluid flows, disposed below the reflection plate, and of which a portion of an upper surface contacts a lower surface of the reflection plate, a gas supply line that supplies an inert gas to a space between the reflection plate and the cooling plate, and an interlock module that cuts off the electric power applied to the IR lamps when a preset condition is satisfied.

According to an embodiment, the back nozzle part may include a nozzle body inserted into the hollow, and a fluid ejection part provided above the nozzle body, the reflection plate and the cooling plate may be coupled to the back nozzle part to be independent from rotation of the chuck stage, and a plurality of discharge holes may be provided, and may be formed to be spaced apart from each other along a circumferential direction of the window when viewed from a top.

According to an embodiment, the support unit may further include a support member inserted into an opening formed in the reflection plate, and positioned on the cooling plate, and the interlock module may include a cutoff member installed in the support member, and that cuts off the electric power delivered from the power source to the IR lamps by opening a closed circuit provided by the power source and the IR lamps according to a change in a temperature of the interior space, and a temperature sensor that measures the temperature of the interior space and deliver the measured temperature of the interior space to the controller that controls the support unit, the cutoff member may include a first cutoff member having a fuse, and a second cutoff member having a bimetal, and the controller may generate a control signal for cutting off the electric power applied to the IR lamps when the temperature of the interior space, which is delivered from the temperature sensor, is higher than a preset temperature.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
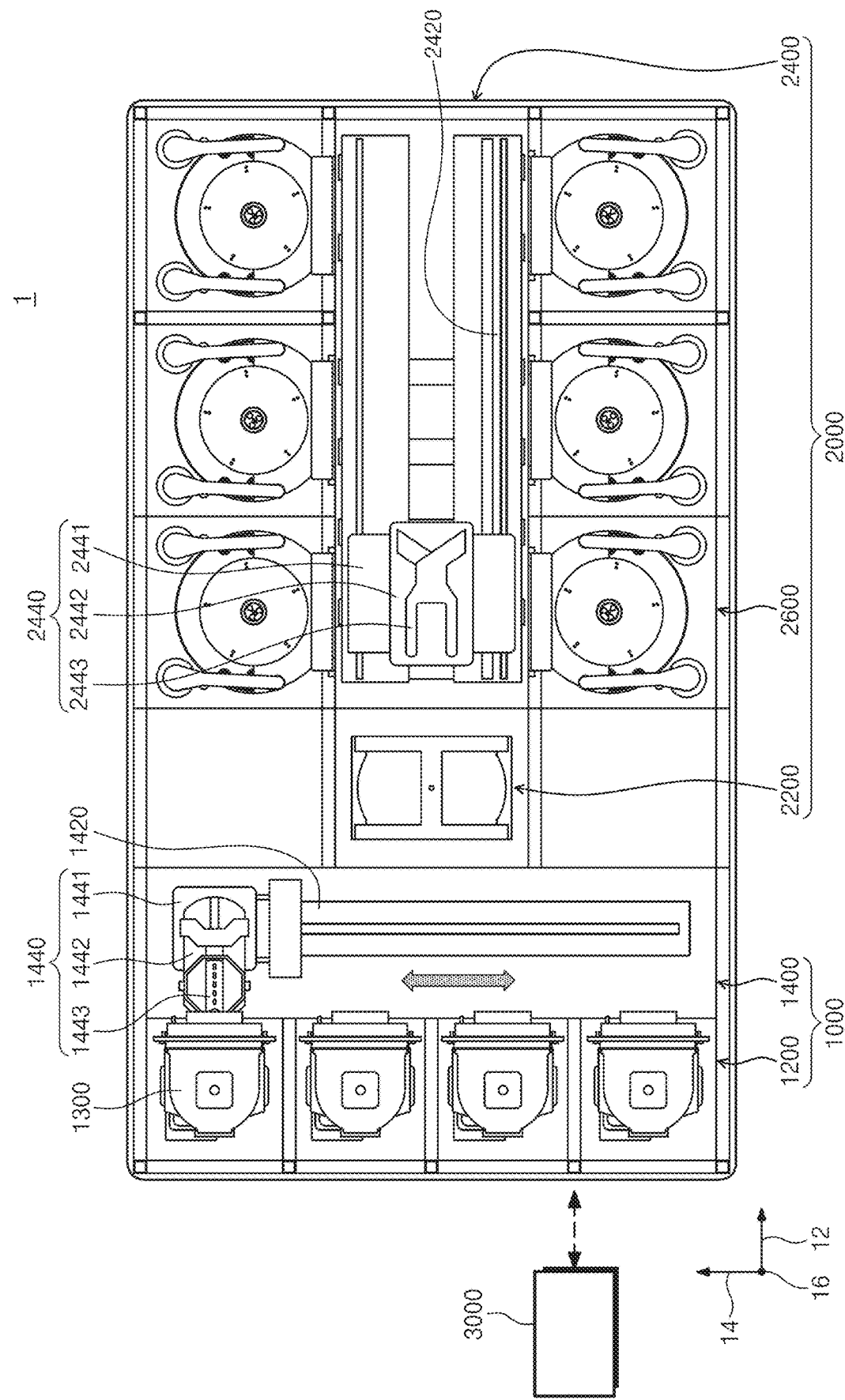
FIG. 1 is a plan view schematically illustrating a substrate treating facility provided with a substrate treating apparatus according to an embodiment of the inventive concept.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a detailed description of preferred embodiments of the inventive concept, a detailed description of related known functions or configurations may be omitted when it may make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

FIG. 1 is a plan view schematically illustrating a substrate treating facility provided with a substrate treating apparatus according to an embodiment of the inventive concept. Referring to FIG. 1, a substrate treating facility 1 includes an index module 1000, a process executing module 2000, and a controller 3000.

The index module 1000 includes a plurality of load ports 1200 and a feeding frame 1400. The load port 1200, the feeding frame 1400, and the process executing module 2000 may be sequentially arranged in a row. Hereinafter, a direction in which the load port 1200, the feeding frame 1400, and the process executing module 2000 are arranged will be referred to as a first direction 12. A direction perpendicular to the first direction 12 when viewed from the top will be referred to as a second direction 14, and a direction normal to a plane including the first direction 12 and the second direction 14 will be referred to as a third direction 16.

A carrier 1300, in which a substrate "W" is received, is seated on the load port 1200. A plurality of load ports 1200 are provided, and are disposed along the second direction 14 in a row. FIG. 1 illustrates that four load ports 1200 are provided. However, the number of the load ports 1200 may increase or decrease according to a condition, such as the process efficiency and the footprint of the process executing module 2000. A plurality of slots (not illustrated) provided to support peripheries of substrates "W" are formed in the carrier 1300. A plurality of slots are provided in the third direction 16. The substrates "W" are stacked in the carrier 1300 while being spaced apart from each other along the third direction 16. A front opening unified pod (FOUP) may be used as the carrier 1300.

The process executing module 2000 includes a buffer unit 2200, a feeding chamber 2400, and a plurality of process chambers 2600. The feeding chamber 2400 is disposed such that the lengthwise direction thereof is in parallel to the first direction 12. The process chambers 2600 are arranged on opposite sides of the feeding chamber 2400 along the second direction 14. The process chambers 2600 situated on one side of the feeding chamber 2400 and the process chambers 2600 situated on an opposite side of the feeding chamber 2400 are symmetrical to each other with respect to the feeding chamber 2400. Some of the process chambers 2600 are disposed along the lengthwise direction of the feeding chamber 2400. Furthermore, some of the process chambers 2600 are disposed to be stacked on each other. That is, the process chambers 2600 having an array of A by B (A and B are natural numbers) may be disposed on one side of the feeding chamber 2400. Here, A is the number of the process chambers 2600 provided in a row along the first direction 12, and B is the number of the process chambers 2600 provided in a row along the third direction 16. When four or six process chambers 2600 are provided on one side of the feeding chamber 2400, the process chambers 2600 may be arranged in an array of 2 by 2 or 3 by 2. The number of the process chambers 2600 may increase or decrease. Unlike the above-mentioned description, the process chambers 2600 may be provided only on one side of the feeding chamber 2400. Further, unlike the above-mentioned description, the process chambers 2600 may be provided on one side or opposite sides of the feeding chamber 2400 to form a single layer.

The buffer unit 2200 is arranged between the feeding frame 1400 and the feeding chamber 2400. The buffer unit 2200 provides a space in which the substrates "W" stay before being transported, between the feeding chamber 2400 and the feeding frame 1400. Slots (not illustrated) in which the substrates "W" are positioned are provided in the buffer unit 2200, and a plurality of slots (not illustrated) are provided to be spaced apart from each other along the third direction 16. A surface of the buffer unit 2200, which faces the feeding frame 1400, and a surface of the buffer unit 2200, which faces the feeding chamber 2400, are opened, respectively.

The feeding frame 1400 transports the substrates "W" between the carrier 1300 seated on the load port 1200 and the buffer unit 2200. An index rail 1420 and an index robot 1440 are provided in the feeding frame 1400. The index rail 1420 is configured such that the lengthwise direction thereof is in parallel to the second direction 14. The index robot 1440 is installed on the index rail 1420, and is linearly moved in the second direction 14 along the index rail 1420. The index robot 1440 has a base 1441, a body 1442, and a plurality of index arms 1443. The base 1441 is installed to be moved along the index rail 1420. The body 1442 is coupled to the base 1441. The body 1442 is provided to be moved along the third direction 16 on the base 1441. The body 1442 is provided to be rotated on the base 1441. The index arms 1443 are coupled to the body 1442, and are provided to be moved forwards and rearwards with respect to the body 1442. A plurality of index arms 1443 are provided to be driven individually. The index arms 1443 are arranged to be stacked so as to be spaced apart from each other along the third direction 16. Some of the index arms 1443 are used when the substrates "W" are transported to the carrier 1300 in the process executing module 2000, and some of the index arms 155 may be used when the substrates "W" are transported from the carrier 1300 to the process executing module 2000. This structure may prevent particles generated from the substrates "W" before the process treatment from being attached to the substrates "W" after the process treatment in the process of carrying the substrates "W" in and out by the index robot 1440.

The feeding chamber 2400 transports the substrates "W" between the buffer unit 2200 and the process chambers 2600, and between the process chambers 2600. A guide rail 2420 and a main robot 2440 are provided in the feeding chamber 2400. The guide rail 2420 is disposed such that the lengthwise direction thereof is parallel to the first direction 12. The main robot 2440 is installed on the guide rail 2420, and is linearly moved along the first direction 12 on the guide rail 2420. The main robot 2440 has a base 2441, a body 2442, and a main arm 2443. The base 2441 is installed to be moved along the guide rail 2420. The body 2442 is coupled to the base 2441. The body 2442 is provided to be moved along the third direction 16 on the base 2441. The body 2442 is provided to be rotated on the base 2441. The main arm 2443 is coupled to the body 2442, and is provided to be moved forwards and rearwards with respect to the body 2442. A plurality of main arms 2443 are provided to be driven individually. The main arms 2443 are arranged to be stacked so as to be spaced apart from each other along the third direction 16. The main arms 2443 used when the substrates "W" are transported from the buffer unit 2200 to the process chambers 2600 and the main arms 2443 used when the substrates "W" are transported from the process chambers 2600 to the buffer unit 2200 may be different.

A substrate treating apparatus 10 that performs a fluid treating process (for example, a cleaning process, or a film removing process such as an etching process) on the substrate "W" is provided in the process chamber 2600. The substrate treating apparatus 10 provided to the process chambers 2600 may have different structures according to the types of the cleaning processes. Selectively, the substrate treating apparatuses 10 in the process chambers 2600 may have the same structure. Selectively, the process chambers 2600 may be classified into a plurality of groups such that the substrate treating apparatuses 10 provided in the process chambers 2600 pertaining to the same group have the same structure and the substrate treating apparatuses 10 provided in the process chambers 2600 pertaining to different groups has different structures. For example, when the process chambers 2600 are classified into two groups, the first group of process chambers 2600 may be provided on one side of the feeding chamber 2400 and the second group of process chambers 2600 may be provided on an opposite side of the feeding chamber 2400. Selectively, the first group of process chambers 2600 may be provided on the lower side of the feeding chamber 2400 and the second group of process chambers 2600 may be provided on the upper side of the feeding chamber 2400, on opposite sides of the feeding chamber 2400. The first group of process chambers 2600 and the second group of process chambers 2600 may be classified according to the kinds of the used chemicals or the types of cleaning methods.

The controller 3000 may control the substrate treating facility 1. The controller 3000 may control the index module 1000 and the process executing module 2000. The controller 3000 may be provided in the process chamber 2600 of the process executing module 2000, and may control the substrate treating apparatus 10, which will be described below. The controller 3000 is included in the substrate treating apparatus 10, and may control a support unit 300, which will be described below. The controller 3000 may receive temperature data delivered from an interlock module 700, which will be described below, and may control the support unit 300 based on the received temperature data.

Furthermore, the controller 3000 may include a process controller including a microprocessor (computer) that executes control of the substrate treating facility 1, a keyboard for inputting commands to allow an operator to manage the substrate treating facility 1, a user interface including a display that visualizes and displays an operation situation of the substrate treating facility 1, and a memory unit for storing a control program for executing processing executed by the substrate treating facility 1 under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

Hereinafter, the substrate treating apparatus 10 provided to the process chamber 2600 of the inventive concept will be described. In the following embodiment, an apparatus for fluid-treating the substrate "W" by using a treatment fluid such as sulfuric acid of high temperature, phosphoric acid of high temperature, alkali chemical, acid chemical and drying gas will be described as an example of the substrate treating apparatus 10. However, the technical spirit of the inventive concept is not limited thereto, and may be applied to all various substrate treating apparatuses that perform a fluid treating process by supplying a treatment fluid to the substrate "W" that is rotating.

Figure 2:
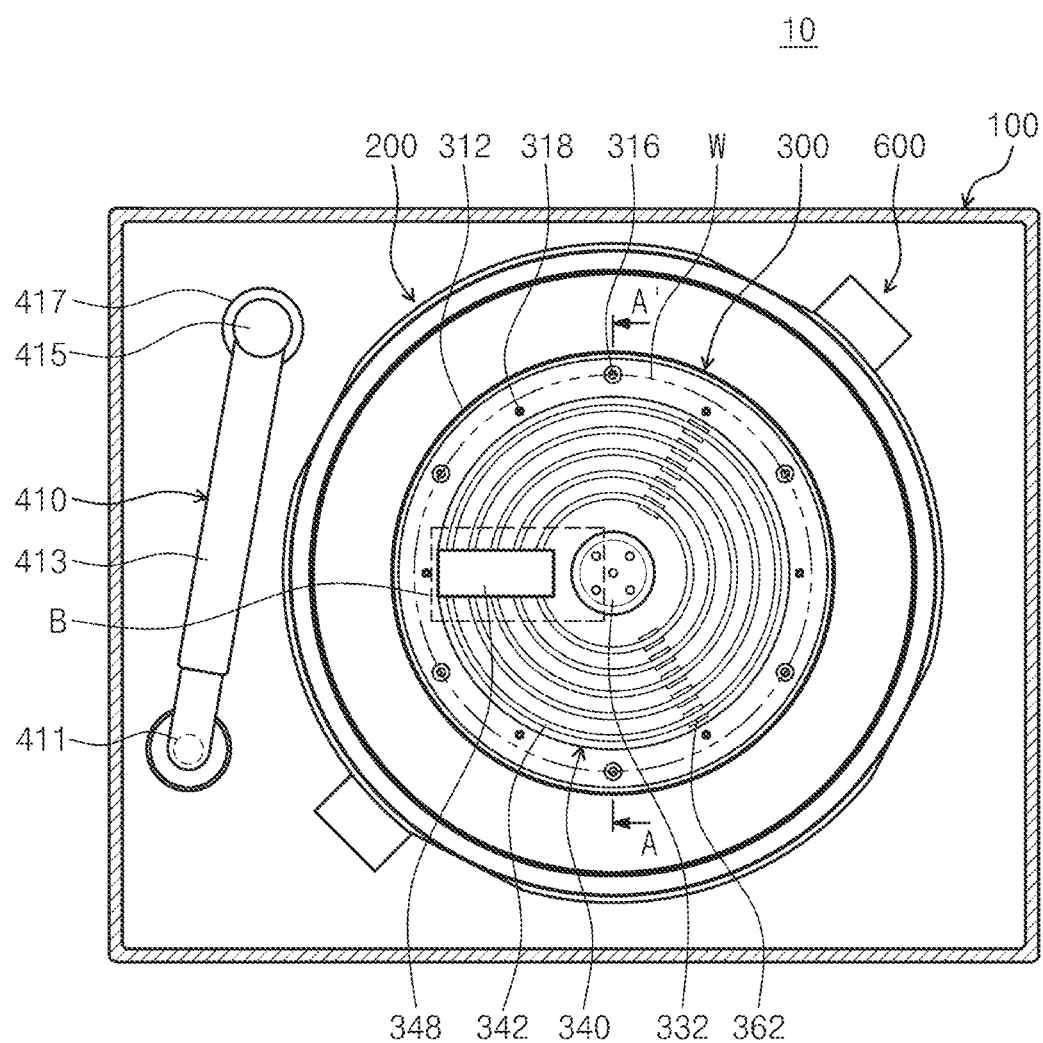
FIG. 2 is a plan view of the substrate treating apparatus of FIG. 1, which is provided in a process chamber.
Figure 3:
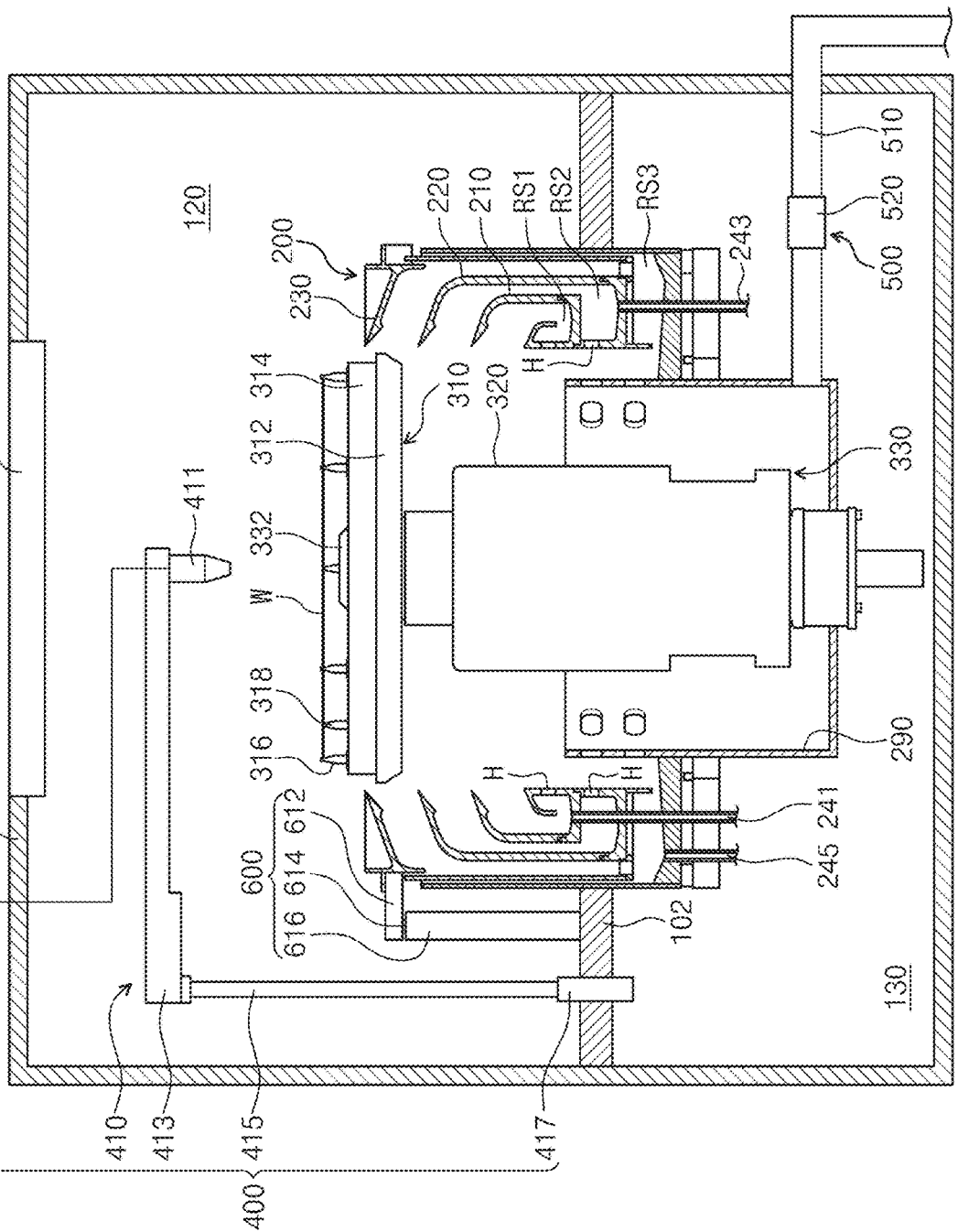
FIG. 3 is a cross-sectional view of the substrate treating apparatus of FIG. 1, which is provided in the process chamber.

FIG. 2 is a plan view of the substrate treating apparatus of FIG. 1, which is provided in a process chamber. FIG. 3 is a cross-sectional view of the substrate treating apparatus of FIG. 1, which is provided in the process chamber. Referring to FIGS. 2 and 3, the substrate treating apparatus 10 includes a chamber 100, a bowl 200, the support unit 300, a fluid supply unit 400, an exhaustion unit 500, an elevation unit 600, and the interlock module 700.

The chamber 100 provides a closed interior space. An air flow supply member 110 is installed on an upper side. The air flow supply member 110 forms downward air flows in an interior of the chamber 100. The air flow supply member 110 filters exterior air of high humidity and supplies the exterior air into the chamber 100. The exterior air of high humidity passes through the air flow supply member 110, and is supplied into the interior of the chamber 100 and forms downward air flows. The downward air flows provide uniform air flows to an upper side of the substrate "W", and discharge contaminants generated in a process of treating a surface of the substrate "W" by the treatment fluid to the exhaustion unit 500, together with air, through recovery vessels 210, 220, and 230 of the bowl 200.

The interior space of the chamber 100 is divided into a process area 120 (an example of the treatment space) and a maintenance/repair area 130 by a horizontal partition wall 102. The bowl 200 and the support unit 300 are located in the process area 120. In addition to recovery lines 241, 243, and 245 connected to the bowl 200, and an exhaust line 510, a driving part of the elevation unit 600, a driving part of a fluid supply unit 300, a supply line, and the like are located in the maintenance/repair area 130. The maintenance/repair area 130 is isolated from the process area 120.

The bowl 200 may have a treatment space for treating the substrate "W" supported by the support unit 300, which will be described below. The bowl 200 has an open-topped cylindrical shape, and has a treatment space for treating the substrate "W". The opened upper surface of the bowl 200 is provided as a carrying-in/out passage for the substrate "W". The support unit 300 is located in the treatment space. The support unit 300 rotates the substrate "W" while supporting the substrate "W" during the process.

The bowl 200 provides a lower space, in which an exhaust duct 290 is connected to a lower end thereof such that compulsory exhaustion is made. A first recovery vessel 210, a second recovery vessel 220, and a third recovery vessel 230, into which the treatment fluid that spatters on the rotating substrate "W" and gases are introduced and suctioned, are disposed in the bowl 200 in multiple stages.

The first recovery vessel 210, the second recovery vessel 220, and the third recovery vessel 230, which are annular, have exhaust holes "H" that are communicated with one common annular space. In detail, each of the first to third recovery vessels 210, 220, and 230 includes a bottom surface having an annular ring shape, and a side wall extending upwards from the bottom surface and having a cylindrical shape. The second recovery vessel 220 surrounds the first recovery vessel 210, and is spaced apart from the first recovery vessel 210. The third recovery vessel 230 surrounds the second recovery vessel 220, and is spaced apart from the second recovery vessel 220.

The first recovery vessel 210, the second recovery vessel 220, and the third recovery vessel 230 may provide a first recovery space RS1, a second recovery space RS2, and a third recovery space RS3, into which the air flows including the treatment fluid that spatters from the substrate "W" and the fumes are introduced. The first recovery space RS1 is defined by the first recovery vessel 210, the second recovery space RS2 is defined by a space between the first recovery vessel 210 and the second recovery vessel 220, and the third recovery space RS3 is defined by a space between the second recovery vessel 220 and the third recovery vessel 230.

Central portions of the upper surfaces of the first recovery vessel 210, the second recovery vessel 220, and the third recovery vessel 230 are opened. Each of the first recovery vessel 210, the second recovery vessel 220, and the third recovery vessel 230 has an inclined surface, of which a distance from a corresponding bottom surface becomes gradually larger as it goes from the connected side wall to an opened part. The treatment fluid that spatters from the substrate "W" flows into the first recovery space RS1, the second recovery space RS2 and/or the third recovery space RS3 along the upper surfaces of the first recovery vessel 210, the second recovery vessel 220, and the third recovery vessel 230.

A first treatment fluid introduced into the first recovery space RS1 is discharged to an outside through the first recovery line 241. A second treatment fluid introduced into the second recovery space RS2 is discharged to an outside through the second recovery line 243. A third treatment fluid introduced into the third recovery space RS3 is discharged to an outside through the third recovery line 245.

The fluid supply unit 400 may treat the substrate "W" by supplying the treatment fluid to the substrate "W". The fluid supply unit 400 may supply the heated treatment fluid to the substrate "W". The treatment fluid may treat a surface of the substrate "W". The treatment fluid may be a chemical of a high temperature for etching the substrate "W", for example, for removing a thin film on the substrate "W". As an example, the chemical may be sulfuric acid, phosphoric acid, or a mixture of sulfuric acid and phosphoric acid. The fluid supply unit 400 may include a fluid nozzle member 410 and a supply unit 420.

The fluid nozzle member 410 may include a nozzle 411, a nozzle arm 413, a support rod 415, and a nozzle driver 417. The nozzle 411 may receive the treatment fluid from the supply unit 420. The nozzle 411 may discharge the treatment fluid to a surface of the substrate "W". The nozzle arm 413 is an arm, a length of which is provided long in one direction, and the nozzle 411 is mounted at a tip end thereof. The nozzle arm 413 supports the nozzle 411. The support rod 415 is mounted at a rear end of the nozzle arm 413. The support rod 415 is located at a lower portion of the nozzle arm 413. The support rod 415 is located at a lower portion of the nozzle arm 413. The nozzle driver 417 is provided at a lower end of the support rod 415. The nozzle driver 417 rotates the support rod 415 about a lengthwise axis of the support rod 415. As the support rod 415 is rotated, the nozzle arm 413 and the nozzle 411 are swung about the support rod 415. The nozzle 411 may be swung between an outside and an inside of the bowl 200. Furthermore, the nozzle 411 may discharge the treatment fluid while being swung in a section between a central area and a peripheral area of the substrate "W".

The exhaustion unit 500 may exhaust an interior of the bowl 200. As an example, the exhaustion unit 500 may provide an exhaust pressure (a suction pressure) to one of the first recovery vessel 210, the second recovery vessel 220, and the third recovery vessel 230, which recovers the treatment fluid during the process. The exhaustion unit 500 may include the exhaust line 510 connected to the exhaust duct 290, and a damper 520. The exhaust line 510 may be provided with an exhaust pressure from an exhaust pump (not illustrated) and is connected to a main exhaust line buried in a bottom space of a semiconductor production line.

Meanwhile, the bowl 200 is coupled to the elevation unit 600 that changes a vertical location of the bowl 200. The elevation unit 600 linearly moves the bowl 200 upwards and downwards. When the bowl 200 is moved upwards and downwards, a relative height of the bowl 200 to the support unit 300 is changed.

The elevation unit 600 includes a bracket 612, a movable shaft 614, and a driver 616. The bracket 612 is fixedly installed on an outer wall of the bowl 200. The movable shaft 614 that is moved upwards and downwards by the driver 616 is fixedly coupled to the bracket 612. When the substrate "W" is loaded on or unloaded from the support unit 300, the bowl 200 is lowered such that the support unit 300 protrudes to an upper side of the bowl 200. Furthermore, when the process is performed, the height of the bowl 200 is adjusted such that the treatment fluid is introduced into the preset recovery vessels 210, 220, and 230 according to the kind of the treatment fluid supplied to the substrate "W". Accordingly, the bowl 200 may make the kinds of the treatment fluids and the contaminated gases recovered for the recovery spaces RS1, RS2, and RS3 different.

Figure 4:
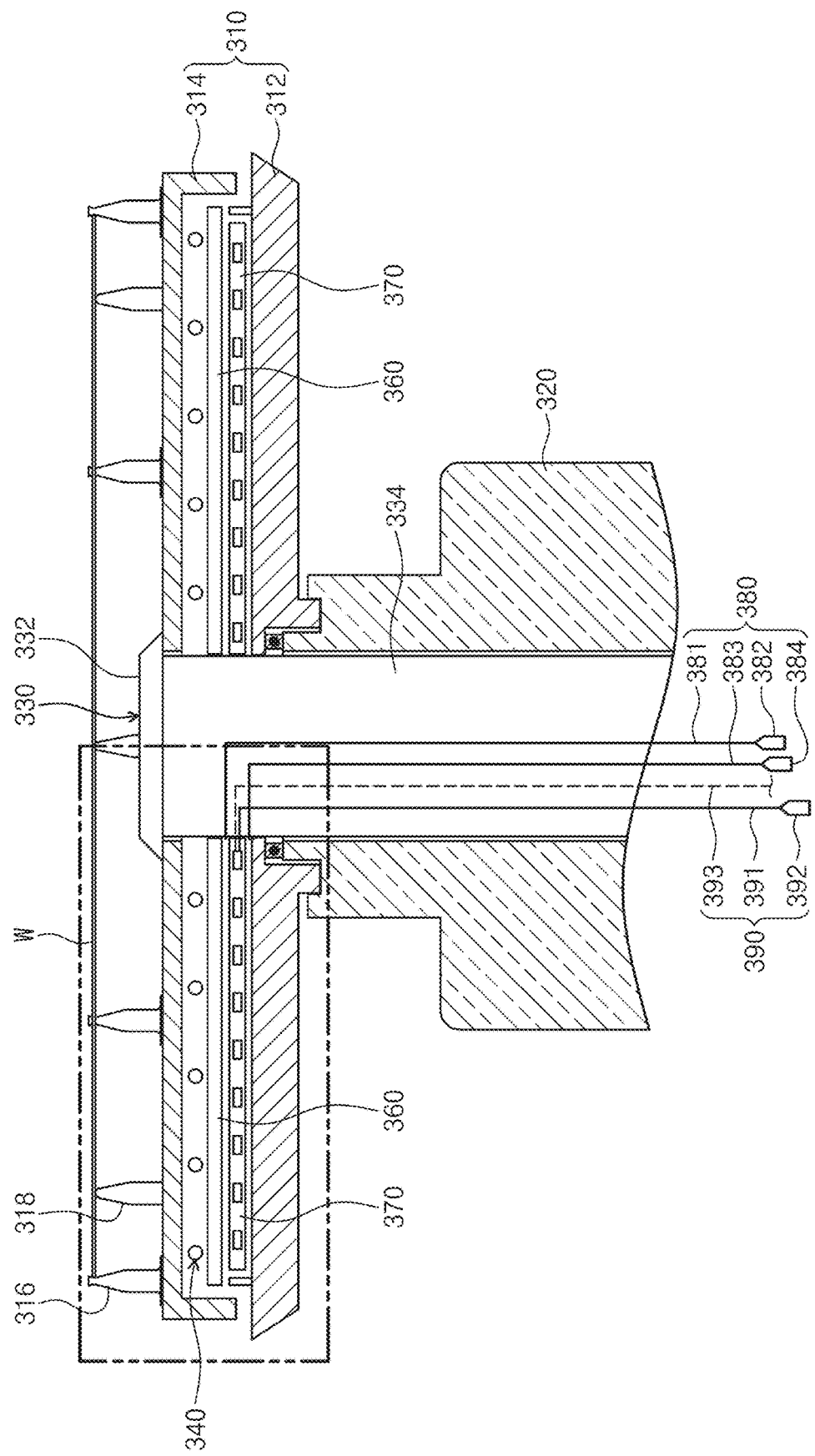
FIG. 4 is a cross-sectional view of a support unit, viewed from direction A-A of FIG. 2.
Figure 5:
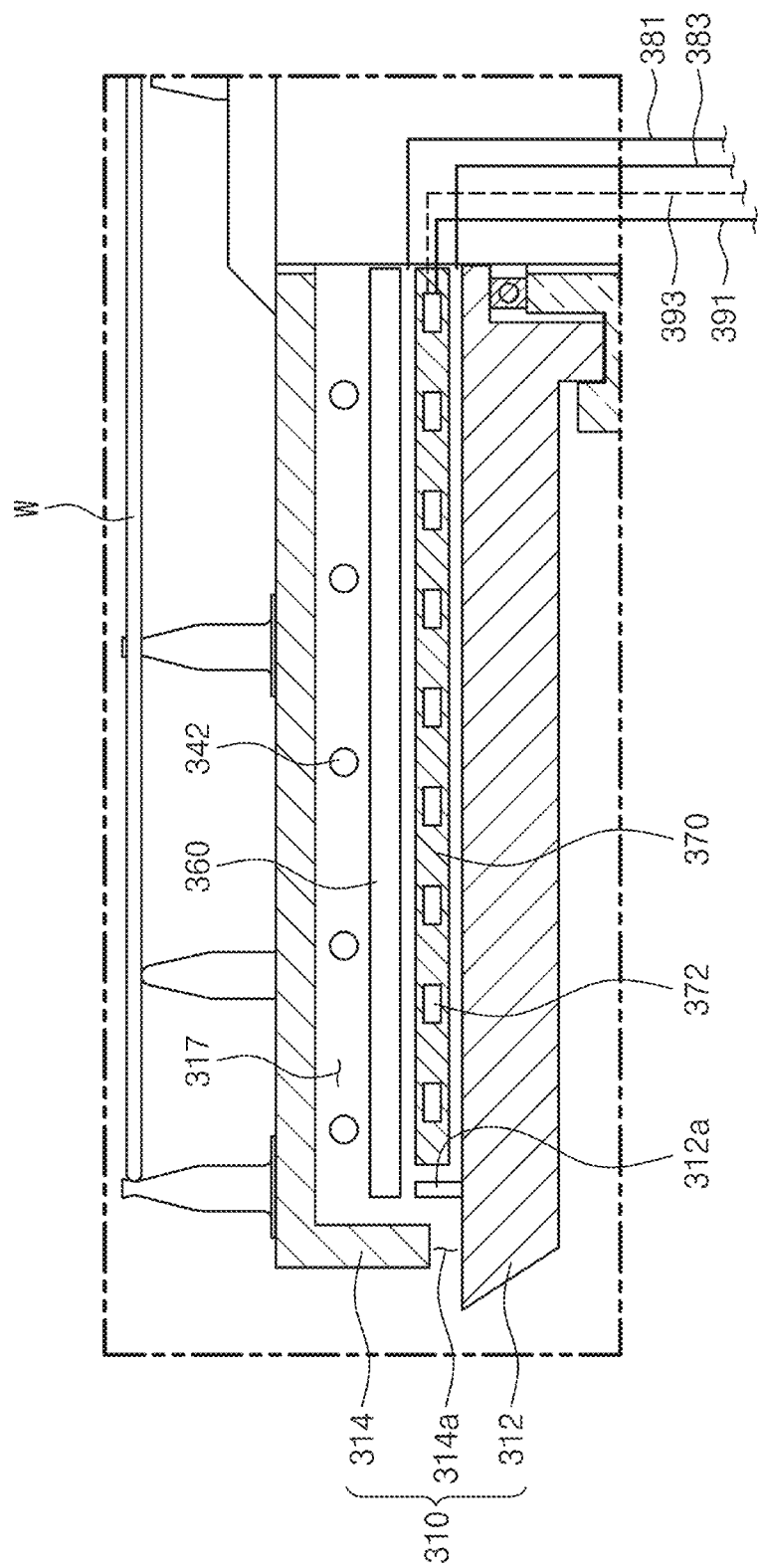
FIG. 5 is an enlarged view illustrating a portion of the support unit of FIG. 4.

FIG. 4 is a cross-sectional view of a support unit, viewed from direction A-A of FIG. 2. FIG. 5 is an enlarged view illustrating a portion of the support unit of FIG. 4. Referring to FIGS. 4 and 5, the support unit 300 may rotate the substrate "W" during the process while supporting the substrate "W" during the process.

The support unit 300 may include a chuck 310, a spin driving part 320, a back nozzle part 330, a heating module 340, a reflection plate 360, a cooling plate 370, a gas supply member 380, and a cooling fluid supply member 390.

The chuck 310 may include a chuck stage 312 and a quartz window 314. The quartz window 314 may be disposed above the chuck stage 312.

The quartz window 314 may be provided to protect a heating member 342, which will be described below. The quartz window 314 may cover the heating member 342. The quartz window 314 may form an interior space 317, in which the heating member 342 is disposed. For example, the quartz window 314 may be combined with the chuck stage 312, which will be described below, to define the interior space 317. Furthermore, the quartz window 314 may have a cover shape that covers the chuck stage 312. The reflection plate 360 and the cooling plate 370, which will be described below, may be disposed in the interior space 317. The chuck stage 312 may be coupled to the spin driving part 320 to be rotatable. The quartz window 314 may be coupled to the chuck stage 312. Accordingly, the quartz window 314 may be rotated together with the chuck stage 312.

The quartz window 314 may be formed of a transparent material such that light generated by the heating member 342, which will be described below, passes therethrough. Furthermore, when viewed from a top, a diameter of the chuck stage 312 may be larger than a diameter of the quartz window 314.

Figure 6:
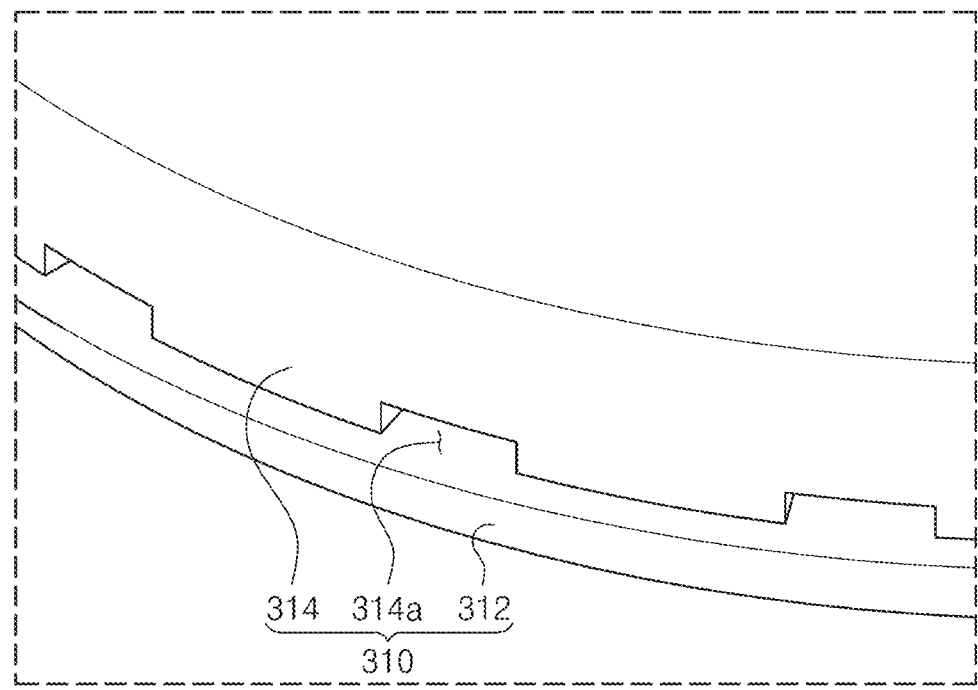
FIG. 6 is an enlarged perspective view illustrating portions of a window and a chuck stage of FIG. 5.

Furthermore, the quartz window 314 may include an upper surface and a side surface. The upper surface of the quartz window 314 may be configured to face a lower surface of the substrate "W" supported by the support unit 300. That is, the upper surface of the quartz window 314 may be a surface that is parallel to the lower surface of the substrate "W" supported by the support unit 300. Furthermore, the side surface of the quartz window 314 may extend downwards from the upper surface at a peripheral area of the quartz window 314. At least one discharge hole 314a, through which an inert gas, which will be described below, is discharged, may be formed on the side surface of the quartz window 314. For example, the discharge hole 314a may be a hole, through which the gas "G" supplied by the gas supply line 380, which will be described below, is discharged. The discharge holes 314a may be formed on the side surface of the quartz window 314, and as illustrated in FIG. 6, may be spaced apart from each other at the same interval. For example, when viewed from a top, the discharge holes 314a may be spaced apart from each other at the same interval along a circumferential direction of the quartz window 314.

Referring to FIG. 5 again, support pins 318 also may be provided in the quartz window 314. The support pins 318 may be disposed at a peripheral portion of the upper surface of the quartz window 314 to be spaced apart from each other. The support pins 318 may be provided to protrude upwards from the quartz window 314. The support pins 318 support the lower surface of the substrate "W" such that the substrate "W" is supported while being spaced upwards apart from the quartz window 314.

Chucking pins 316 may be installed at a periphery of the chuck stage 312. The chucking pins 316 are provided to pass through the quartz window 314 to protrude to an upper side of the quartz window 314. The chucking pins 316 arrange the substrate "W" such that the substrate "W" supported by the plurality of support pins 318 may be positioned at a proper location. During the process, the chucking pins 316 contact a side of the substrate "W" to prevent the substrate "W" from deviating from the proper location.

Furthermore, a blocking boss 312a may be formed in the chuck stage 312. The blocking boss 312a may block external impurities of the support unit 300 from being introduced into the interior space 317 of the chuck 310. The blocking boss 312a may have a ring shape when viewed from a top. The blocking boss 312a may be provided to surround the cooling plate 370, which will be described below, when viewed from a top. Furthermore, the blocking boss 312a may be provided to overlap the reflection plate 360, when viewed from a top. Furthermore, the blocking boss 312a may be provided such that an upper end thereof is spaced apart from the reflection plate 360. A spacing space between the upper end of the blocking boss 312a and the reflection plate 360 may function as a discharge opening, through which the inert gas, which will be described below, is discharged.

The chuck stage 312 may be coupled to the spin driving part 320 to be rotatable. The spin driving part 320 may include a hollow motor, and may be provided as a hollow rotary shaft having a hollow. At least any one of a first gas supply line 381, a second gas supply line 383, a cooling fluid supply line 391, and a cooling fluid discharge line 393, which will be described below, may be provided in the hollow of the spin driving part 320.

As described below, when the chuck stage 312 is rotated, the quartz window 314 may be rotated together with the chuck stage 312. Furthermore, the configurations provided in the chuck 310 may be located independently from rotation of the chuck 310. For example, the heating member 342, the reflection plate 360, the cooling plate 370, the first gas supply line 381, the second gas supply line 383, a cooling fluid supply line 391, the cooling fluid discharge line 393, a fuse 722, a bimetal 732, a first line 724, a second line 734, and a temperature sensor 710, which will be described below, may be located independently from rotation of the chuck 310.

The back nozzle part 330 is provided to supply the treatment fluid, for example, a chemical to the rear surface of the substrate "W". The back nozzle part 330 may include a fluid ejection part 332 and a nozzle body 334. The nozzle body 334 may be coupled to the fluid ejection part 332. For example, the fluid ejection part 332 may be coupled to an upper end of the nozzle body 334. The fluid ejection part 332 may receive the chemical from a chemical supply line (not illustrated) and supply the treatment fluid to the rear surface of the substrate "W". The nozzle body 334 may extend upwards and downwards, and may have a vessel shape having a space in an interior thereof. The nozzle body 334 may be inserted into the hollow of the spin driving part 320, and may be located independently from rotation of the spin driving part 320 and the chuck stage 312. Furthermore, the reflection plate 360 and the cooling plate 370, which have been described above, may be coupled to the nozzle body 334, and may be provided independently from rotation of the chuck stage 312 and the spin driving part 320.

The heating module 340 may heat the substrate "W" during the process. The heating module 340 may include the heating member 342, a power source line 344, a power source 346, a switch 347, a terminal member 348, and a support member 349.

The heating member 342 may be disposed above the chuck stage 312. The heating member 342 may be disposed below the quartz window 314. The heating member 342 may be disposed between the chuck stage 312 and the quartz window 314. The heating member 342 may be directly or indirectly coupled to the nozzle body 334, and may be provided independently from rotation of the chuck stage 312. For example, the heating member 342 may be supported by support brackets 362 provided above the reflection plate 360. Accordingly, the heating member 342 may be provided independently from the chuck stage 312. The heating member 342 may heat the substrate "W" supported by the support unit 300. The heating member 342 may deliver thermal energy to the substrate "W" supported by the support unit 300 to heat the substrate "W". The heating member 342 may irradiate light to the substrate "W" supported by the support unit 300 to heat the substrate "W". The light may be light that has a wavelength of an infrared ray area. Unlike this, the light may be light that has a wavelength of an ultraviolet ray area. The heating member 342 may have a hook shape. The heating member 342 may be provided to surround the above-described nozzle body 334, when viewed from a top. A plurality of heating members 342 may be provided. The heating member 342 may be provided to surround the above-described nozzle body 334, when viewed from a top. The heating members 342 may be provided to have different diameters when viewed from a top. For example, when viewed from a top, an inner diameter of any one of the heating members 342 may be smaller than an inner diameter of another one of the heating members 342. For example, the heating member 342 may be a lamp. For example, the heating member 342 may be an IR lamp. However, the inventive concept is not limited thereto, and the heating member 342 may be variously modified by using a known material that irradiates light capable of heating the substrate "W".

Furthermore, the thermal energy (for example, an output of light generated by the heating member 342) generated by the heating members 342 may be controlled individually. The heating member 342 may perform a control to continuously increase or decrease temperature according to a radius of the substrate "W" during the process by controlling temperatures in individual sections. In the present embodiment, five heating members 342 are illustrated, but this is merely one embodiment, and the number of the heating members 342 may be increased or decreased depending on a desired temperature to be controlled.

A description of the power source line 344, the power source 346, the switch 347, the terminal member 348, and the support member 349 of the heating module 340 will be made later.

The reflection plate 360 may be disposed below the heating member 340. The reflection plate 360 may be disposed below the heating member 342. The reflection plate 360 may reflect thermal energy generated by the heating member 342 to the substrate "W". The reflection plate 360 may reflect thermal energy generated by the heating member 342 to a peripheral area of the substrate "W" and/or a central area of the substrate "W". The reflection plate 360 may be formed of a material having a high reflection efficiency for thermal energy generated by the heating member 340. The reflection plate 360 may be formed of a material having a high reflection efficiency for the light irradiated by the heating member 342. For example, the reflection plate 360 may be formed of a material including gold, silver, copper, and/or aluminum. The reflection plate 360 may be formed of a material obtained by coating gold, silver, copper, and/or aluminum on quartz. The reflection plate 360 may be formed of a material obtained by coating gold, silver, copper, and/or aluminum on quartz through physical vapor deposition (PVD) scheme.

The cooling plate 370 may be disposed below the reflection plate 360. A cooling passage 372, through which a cooling fluid flows, may be formed in the cooling plate 370. The cooling fluid supply member 390 may supply the cooling fluid to the cooling passage 372. The cooling fluid supply member 390 may include a cooling fluid supply line 391, a cooling fluid supply source 392, and a cooling fluid discharge line 393. The cooling fluid supply line 391 may receive the cooling fluid from the cooling fluid supply source 392 and supply the cooling fluid to the cooling passage 372. The cooling plate 370 may be formed of a material having an excellent thermal conductivity. For example, the cooling plate 370 may be formed of a material including aluminum.

Figure 7:
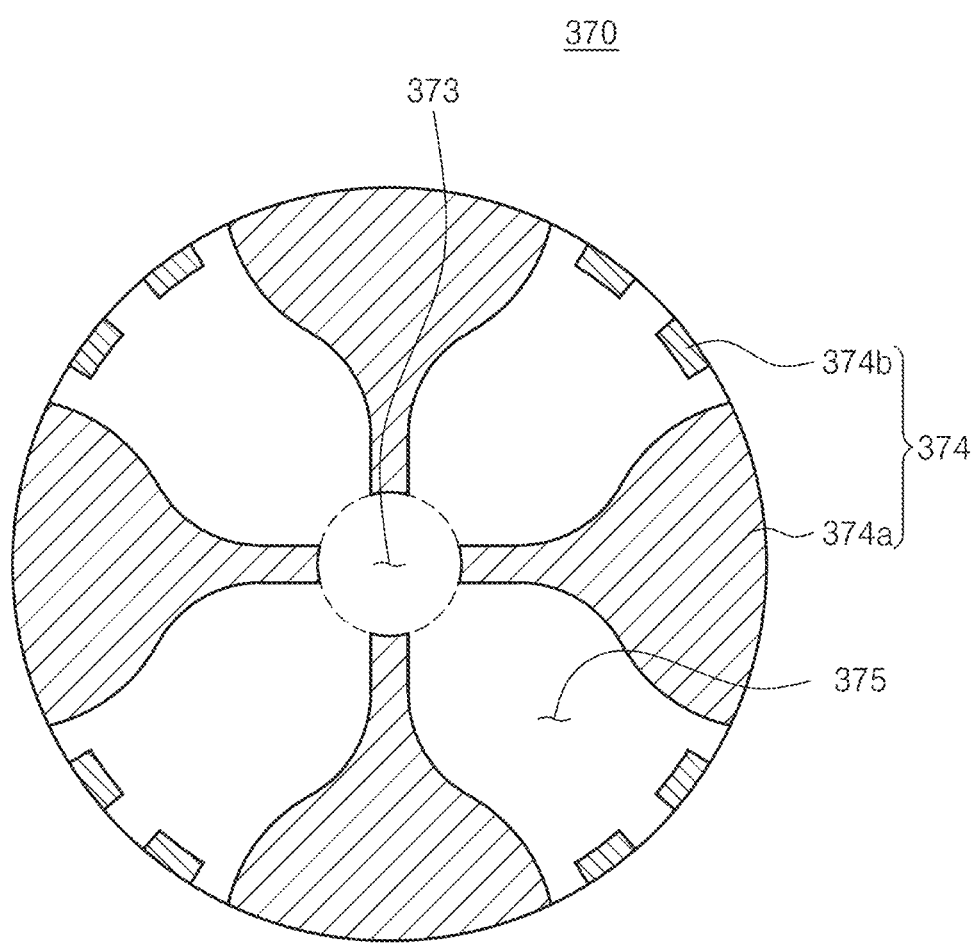
FIG. 7 is a view of a cooling plate of FIG. 5, when viewed from a top.

Furthermore, the cooling plate 370 may have a diameter that is smaller than that of the reflection plate 360 when viewed from a top. Furthermore, the cooling plate 370 may contact the reflection plate 360. Furthermore, a partial area of the upper surface of the cooling plate 370 may contact the reflection plate 360, and another area of the upper surface of the cooling plate 370 may be spaced apart from the reflection plate 360. For example, as illustrated in FIG. 7, a central hole 373, a contact part 374, and a spacing part 375 may be formed in the cooling plate 370. The contact part 374 of the upper surface of the cooling plate 370 may contact a lower surface of the reflection plate 360. The spacing part 375 of the upper surface of the cooling plate 370 may be spaced apart from the lower surface of the reflection plate 360 to define a gap space, through which the inert gas "G", which will be described below, is introduced. That is, the contact part 374 may be higher than the spacing part 375. The spacing part 375 may be lower than the contact part 374. Furthermore, when viewed from the top, a ratio of the contact part 374 to the spacing part 375 per unit area may be larger in a peripheral area of the cooling plate 370 than in a central area of the cooling plate 370. That is, the peripheral area of the cooling plate 370 may contact the reflection plate 360 more, and the central area of the cooling plate 370 may contact the reflection plate 360 less. This is because the quartz window 314 has a side surface whereby more thermal energy generated by the heating members 342 may be contained in the peripheral area of the quartz window 314. Accordingly, because a temperature of the peripheral area of the reflection plate 360 may be higher than a temperature of the central area of the reflection plate 360, the cooling plate 370 has a structure, in which it may contact the reflection plate more in the peripheral area.

Furthermore, the contact part 374 may include a first contact part 374a and a second contact part 374b. The first contact part 374a may be formed to reach the peripheral area of the cooling plate 370 from the central hole 373, and the second contact part 374b may be formed in the peripheral area of the cooling plate 370. Furthermore, a plurality of second contact parts 374b may be provided. The second contact parts 374b may be formed to be spaced apart from each other. Areas between adjacent second contact parts 374b and between the second contact parts 374b and the first contact part 374a may function as discharge openings, through which the inert gas, which will be described below, is discharged.

Referring to FIGS. 4 and 5 again, the gas supply member 380 may supply the gas "G" to the interior space 317 defined by the chuck stage 312 and the quartz window 314. The gas "G" supplied to the interior space 317 by the gas supply member 380 may be a cooling gas. The gas supply member 380 may include a first gas supply line 381, a first gas supply source 382, the second gas supply line 383, and a second gas supply source 384. The gas "G" supplied to the interior space 317 by the gas supply member 380 may be an inert gas. For example, the gas "G" may be an inert gas including nitrogen, argon, and the like. However, the inventive concept is not limited thereto, and the gas "G" may be modified to various known inert gases. The first gas supply line 381 may receive the gas "G" from the first gas supply source 382, and may supply the gas "G" to a space between the cooling plate 370 and the reflection plate 360. The second gas supply line 383 may receive the gas "G" from the second gas supply source 384, and may supply the gas "G" to a lower area of the cooling plate 370.

Figure 8:
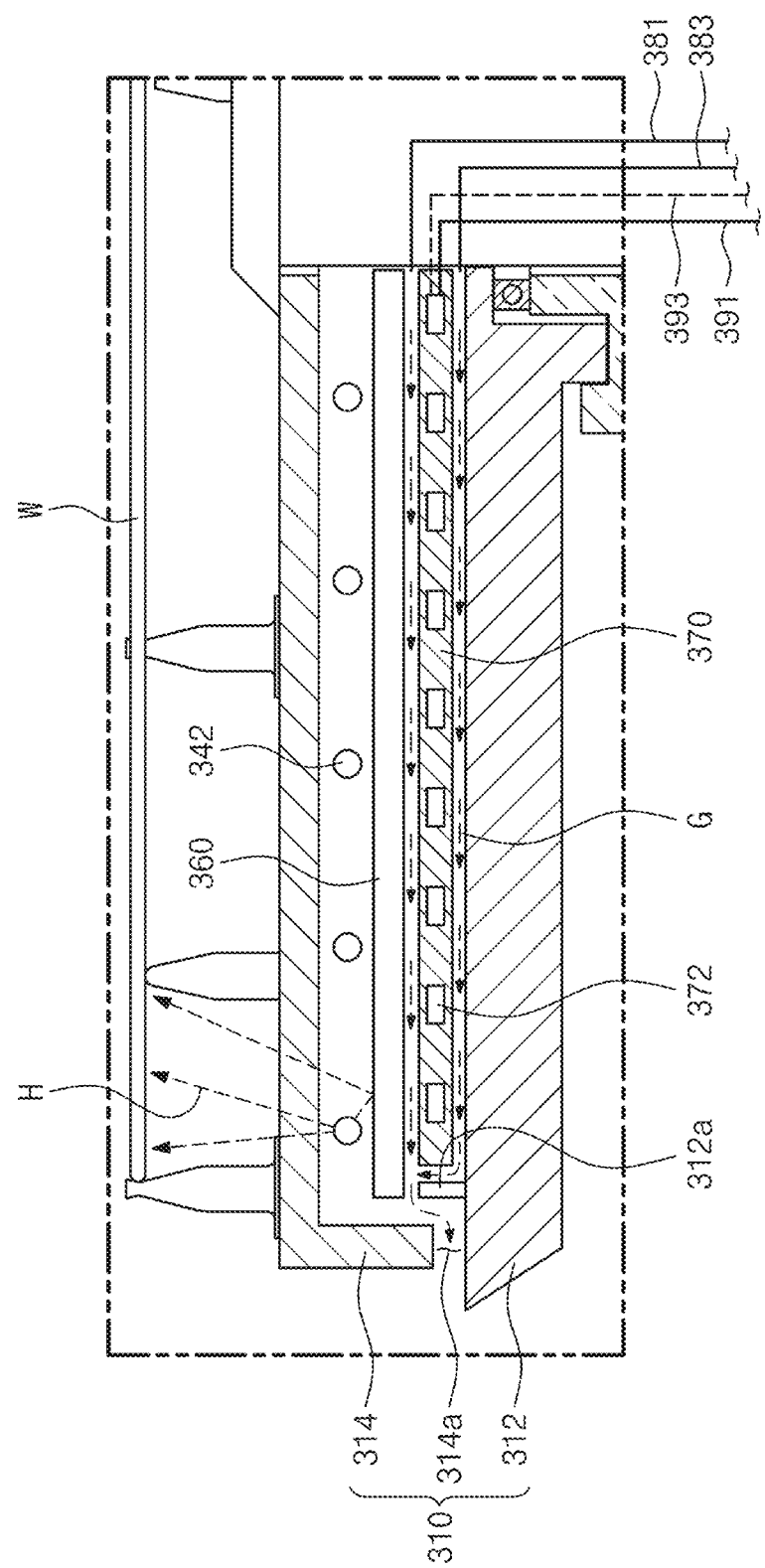
FIG. 8 is a view illustrating a state, in which the support unit of FIG. 4 heats a substrate.

FIG. 8 is a view illustrating a state, in which the support unit of FIG. 4 heats a substrate. Referring to FIG. 8, thermal energy "H" generated by the heating member 342 may be directly delivered to the substrate "W" or may be reflected by the reflection plate 360 to be indirectly delivered to the substrate "W". Then, a temperature of the reflection plate 360 may be increased by the thermal energy "H" generated by the heating member 342. When the temperature of the reflection plate 360 is increased, the heat of the reflection plate 360 may be delivered to the spin driving part 320, and when the temperature of the spin driving part 320 is increased, the connected spin driving part 320 including the hollow motor cannot be driven properly or the hollow motor may break down. Accordingly, it is very important to minimize the heat of the reflection plate 360 heated by the heating member 342 from being delivered to the spin driving part 320. According to an embodiment of the inventive concept, a cooling water may flow in the cooling passage 372 of the cooling plate 370. Furthermore, the cooling plate 370 may contact the reflection plate 360. That is, the cooling plate 370 may prevent the temperature of the reflection plate 360 from being excessively increased in a water cooling scheme.

According to occasions, the cooling water that flows in the cooling passage 372 of the cooling plate 370 may be boiled by the heat of the reflection plate 360. Accordingly, the cooling plate 370 according to an embodiment of the inventive concept may include the contact part 374 and the spacing part 375. That is, the entire upper surface of the cooling plate 370 does not contact the lower surface of the reflection plate 360, but a partial area of the upper surface of the cooling plate 370 contacts the reflection plate 360. Furthermore, the inert gas "G" supplied by the gas supply member 380 may flow in a space between another area of the upper surface of the cooling plate 370, which does not contact the reflection plate 360, and the lower surface of the reflection plate 360. The inert gas "G" supplied by the gas supply member 380 may block a portion of the heat of the reflection plate 360 heated by the heating member 342 from being delivered to the cooling plate 370. Furthermore, a portion of the heat of the reflection plate 360 may be delivered to the gas "G", and may be discharged to an outside through the discharge hole 314a. That is, according to an embodiment of the inventive concept, a partial area of the upper surface of the cooling plate 370 may contact the reflection plate 360 and the inert gas "G" may be supplied to a space defined as the cooling plate 370 and the reflection plate 360 are spaced apart from each other, whereby boiling of the cooling water that flows in the cooling passage 372 may be restrained maximally. That is, according to an embodiment of the inventive concept, the reflection plate 360 may be effectively cooled in a water-cooling scheme having a better cooling efficiency than that of the air-cooling scheme (this is because a specific heat of the cooling water used in the water-cooling scheme is higher than a specific heat of cooling gas used in the air-cooling scheme as compared with the air-cooling scheme) or the heat of the reflection plate 360 may be prevented from being delivered to the spin driving part 320, and boiling of the cooling water that may occur when the water-cooling scheme is used may be maximally restrained by the air-cooling scheme of supplying the inert gas "G". That is, because heat may be maximally restrained from being delivered to the spin driving part 320, a process of treating the substrate "W" may be stably performed for a longer period of time. Furthermore, a cooling effect of the reflection plate 360 may be selectively controlled by disposing a selected one of the plurality of cooling plates 370 having different contact areas which contact the reflection plate 360 in the interior space 317. This is because a thermal conductivity degree is changed according to a contact area of the cooling plate 370 and the reflection plate 360.

Furthermore, as described above, the blocking boss 312a formed in the chuck stage 312 may prevent the treatment fluid supplied by the fluid supply unit 400 from being introduced into the interior space 317 of the chuck 310. Furthermore, the inert gas "G" supplied by the above-described gas supply member 380 may flow in a direction that faces an exterior space of the chuck 310 from the interior space 317 of the chuck 310 through the discharge hole 314a. Furthermore, in regard to the inert gas "G" supplied by the gas supply member 380, the pressure of the interior space 317 of the chuck 310 may be a relatively positive pressure when compared with a pressure of the outer space of the chuck 310. Accordingly, even when the substrate "W" is rotated at a relatively low speed, the treatment fluid supplied by the fluid supply unit 400 may be maximally restrained from being introduced into the interior space of the chuck 310.

Furthermore, as described above, due to an abnormal operation of the heating member 342, and a breakdown of a component that operates the heating member 342, or the like, the heating member 342 may generate heat that is more than necessary. In this case, the heat generated by the heating member 342 may excessively increase a temperature of the interior space 317. When the temperature of the interior space 317 is excessively increased, a danger of explosion of the support unit 300 may be increased. Furthermore, when the temperature of the interior space 317 is excessively increased, the heat may be delivered to the spin driving part 320. The heat may cause a breakdown of the spin driving part 320. Accordingly, the inventive concept includes the interlock module 700 that cuts off electric power delivered to the heating member 342 when a preset condition is satisfied. For example, the preset condition may mean a case, in which a temperature of the interior space 317 becomes higher than a preset temperature. However, the inventive concept is not limited thereto, and the preset condition may be variously modified according to necessities.

Figure 9:
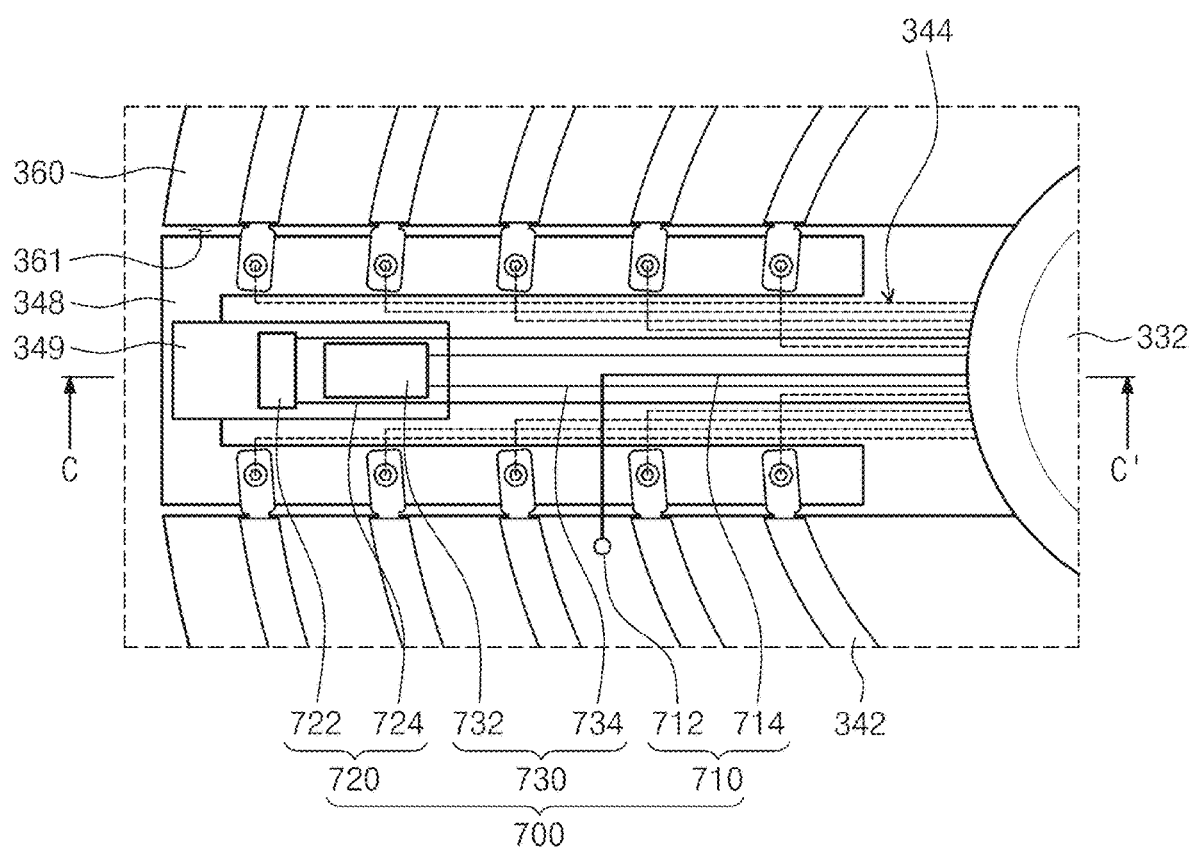
FIG. 9 is an enlarged view of area "B" of FIG. 2.
Figure 10:
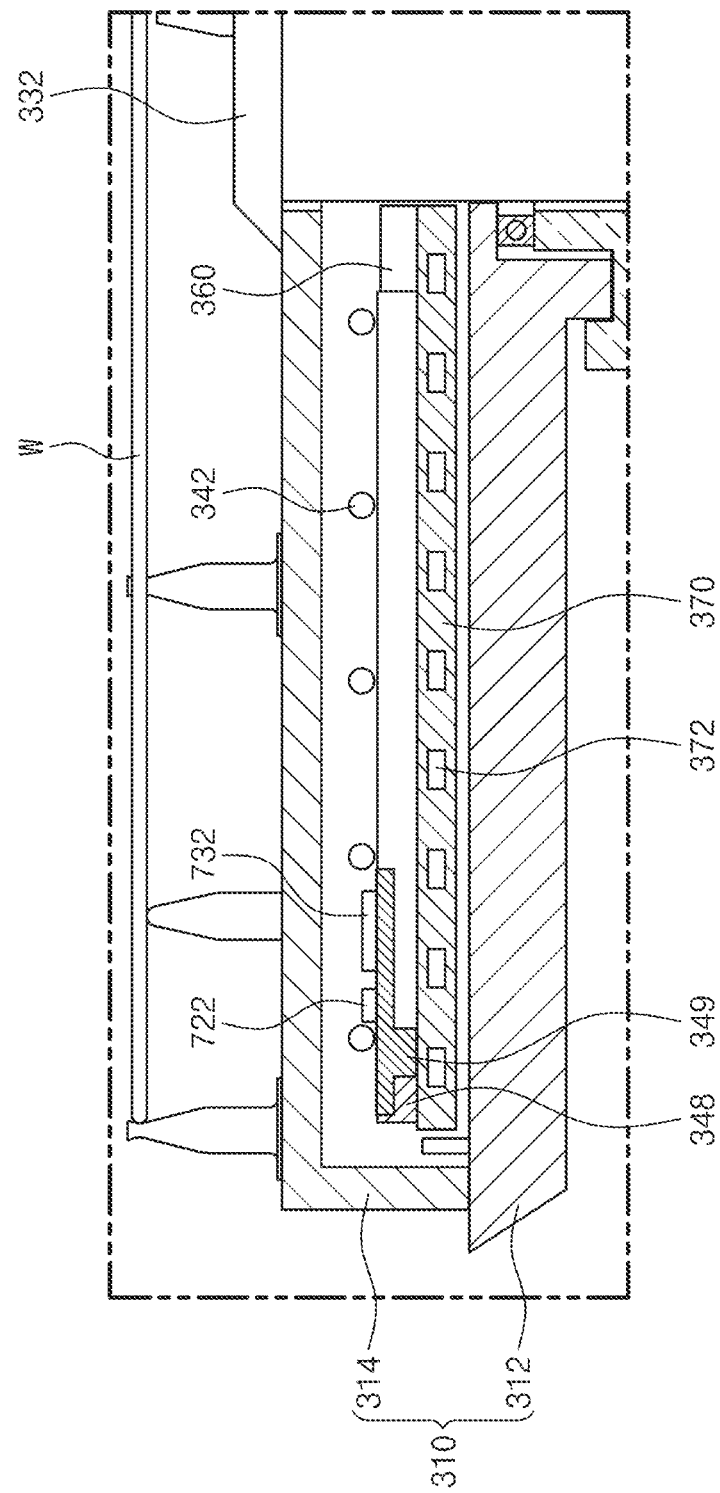
FIG. 10 is a cross-sectional view of a support unit, viewed from direction C-C' of FIG. 9.

Hereinafter, the interlock module 700 according to the embodiment of the inventive concept will be described in detail. FIG. 9 is an enlarged view of area "B" of FIG. 2. FIG. 10 is a cross-sectional view of a support unit, viewed from direction C-C' of FIG. 9

Referring to FIGS. 9 and 10, an opening 361 may be formed in the reflection plate 360. The opening 361 formed in the reflection plate 360 may extend from the central area of the reflection plate 360 along a radial direction of the reflection plate 360 when viewed from a top. The opening 361 may extend from an upper surface to a lower surface of the reflection plate 360. That is, the opening 361 may pass through the reflection plate 360.

The terminal member 348 may be inserted into the opening 361 formed in the reflection plate 360. The terminal member 348 may substantially have a substantially stapler shape when viewed from a top. An opened part of the stapler shaped terminal member 348, which is viewed from a top, may face the fluid ejection part 332. Furthermore, one end and an opposite end of the heating member 342 having a hook shape may be coupled to the terminal member 348. The terminal member 348 may perform a function as a medium that delivers the electric power of the power source 346, which is applied by the power source line 344, to the heating member 342. That is, the power source line 344 may be connected to the terminal member 348. Furthermore, at least a portion of the power source line 344 may be provided in an interior space of the nozzle body 334. Furthermore, because the terminal member 348 is inserted into the opening 361 formed in the reflection plate 360, the terminal member 348 may be positioned on the upper surface of the cooling plate 370 disposed below the reflection plate 360.

For example, the lower surface of the terminal member 348 may be provided to contact the upper surface of the cooling plate 370.

The support member 349 may be inserted into the opening 361 formed in the reflection plate 360. That is, the support member 349 may be disposed at a location, at which it overlaps the opening 361, when viewed from a top. The support member 349 may be coupled to the terminal member 348. The support member 349 may have a shape, in which an area of an upper surface thereof is larger than an area of a lower surface thereof. The support member 349 may be disposed above the cooling plate 370. The lower surface of the support member 349 may directly contact the cooling plate 370, or may be spaced apart from the cooling plate 370 by a small interval. Furthermore, upper sides of the terminal member 348 and the support member 349 may be covered by a cover (not illustrated) to protect points, at which the terminal member 348, the power source line 344, and the heating member 342 are connected to each other. Furthermore, the terminal member 348 and the support member 349 may be provided independently from rotation of the chuck stage 312. Furthermore, FIGS. 9 and 10 illustrate as an example that the terminal member 348 and the support member 349 are separate configurations and the configurations are fastened to each other, but the terminal member 348 and the support member 349 may be provided as one body.

The interlock module 700 may include at least one of the temperature sensor 710, a first cutoff member 720, and a second cutoff member 730. For example, the interlock module 700 may include the temperature sensor 710, the first cutoff member 720, and the second cutoff member 730.

The temperature sensor 710 may include a probe 712 and a sensor line 714. The probe 712 may be provided at one end of the sensor line 714. The probe 712 may measure a temperature of the interior space 317, and may deliver the measured temperature to the controller 3000 through the sensor line 714. The probe 712 may be disposed adjacent to the terminal member 348. The probe 712 may be disposed between the plurality of heating members 342. For example, the probe 712 may be disposed between the second and third heating members 342 in a sequence of the heating members 342 that are closer to the nozzle body 334. At least a portion of the sensor line 714 may be provided in the interior space of the nozzle body 334. Furthermore, a location of the sensor line 714 may be fixed by the terminal member 348, which will be described below. For example, a tap may be formed in the terminal member 348, which will be described below, a mood bolt may be fastened to the tap, and the sensor line 714 may be inserted into a hole of the mood bolt.

The cutoff members 720 and 730 may be installed in the support member 349, and the electric power delivered to the heating member 342 by the power source 346 may be cut off by opening the closed circuit provided by the power source 346 and the heating member 342 according to a change in the temperature of the interior space 317. The cutoff members 720 and 730 may be provided in the closed circuit provided by the power source 346 and the heating member 342. Furthermore, a signal that allows the controller 3000 to generate a control signal for opening the closed circuit provided by the power source 346 and the heating member 342 according to a change in the temperature of the interior space 317 may be delivered to the controller 3000. Furthermore, the cutoff members 720 and 730 may include the first cutoff member 720 and the second cutoff member 730.

The first cutoff member 720 may include the fuse 722 and the first line 724. The first line 724 may electrically connect the fuse 722 to the heating member 342 and the power source 346. The second cutoff member 730 may include the bimetal 732 and the second line 734. The second line 734 may electrically connect the bimetal 732 to the heating member 342 and the power source 346. The fuse 722 and the bimetal 732 may be located to overlap the opening 361 when viewed from a top. For example, the fuse 722 and the bimetal 732 may be installed in the support member 349 inserted into the opening 361. For example, the fuse 722 and the bimetal 732 may be installed on the upper surface of the support member 349 inserted into the opening 361. The fuse 722 and the bimetal 732 may have a structure that may cut off electric power according to a change in temperature.

The first cutoff member 720 and the second cutoff member 730 may have a power cutoff structure that cuts off electric power delivered from the power source line 344 to the heating member 342 when the temperature of the interior space 317 is increased. The first cutoff member 720 having the fuse 722 has a power cutoff structure, in which a fuse line of the fuse 722 is broken to cut off electric power when the temperature of the interior space 317 is increased. That is, because the closed circuit provided by the power source 346 and the heating member 342 is opened when the fuse line of the fuse 722 is broken, the electric power delivered from the power source 346 to the heating member 342 may be cut off. Furthermore, the second cutoff member 730 having the bimetal 732 has a power cutoff structure, in which metal plates of the bimetal having different thermal expansion coefficients are thermally deformed to cut off electric power when the temperature of the interior space 317 is increased. That is, because the closed circuit provided by the power source 346 and the heating member 342 is opened when the bimetal 732 is thermally deformed, the electric power delivered from the power source 346 to the heating member 342 may be cut off.

Meanwhile, the interior space may become a very high temperature (for example, a temperature of about 600° C. or more) even though the heating members 342 are not abnormally operated, and when the first cutoff member 720 and the second cutoff member 730 are disposed in the interior space 317 as they are, the fuse line may be broken or the metal plates may be thermally deformed even though the heating members 342 are not abnormally operated. For example, an interlock sensing condition of the fuse 722, that is, a temperature condition, in which the fuse line of the fuse 722 is broken, may be about 160° C. (an example of a first temperature). For example, an interlock sensing condition of the bimetal 732, that is, a temperature condition, in which the bimetal is thermally deformed, may be about 180° C. (an example of a second temperature). When the fuse 722 and the bimetal 732 are disposed in the interior space 317 as they are, the first cutoff member 720 and the second cutoff member 730 perform an interlock even through the heating members 342 are not abnormally operated.

Accordingly, the first cutoff member 720 and the second cutoff member 730 according to an embodiment of the inventive concept may be disposed to overlap the opening 361 formed in the reflection plate 360. Accordingly, a partial area of the cooling plate 370 is exposed toward the terminal member 348 and the support member 349. For example, as described above, the first cutoff member 720 and the second cutoff member 730 are installed in the support member 349. Accordingly, a problem, in which the fuse line is broken or the metal plates are thermally deformed when the heating members 342 are not abnormally operated may be solved by cooling air of the cooling plate 370.

Figure 11:
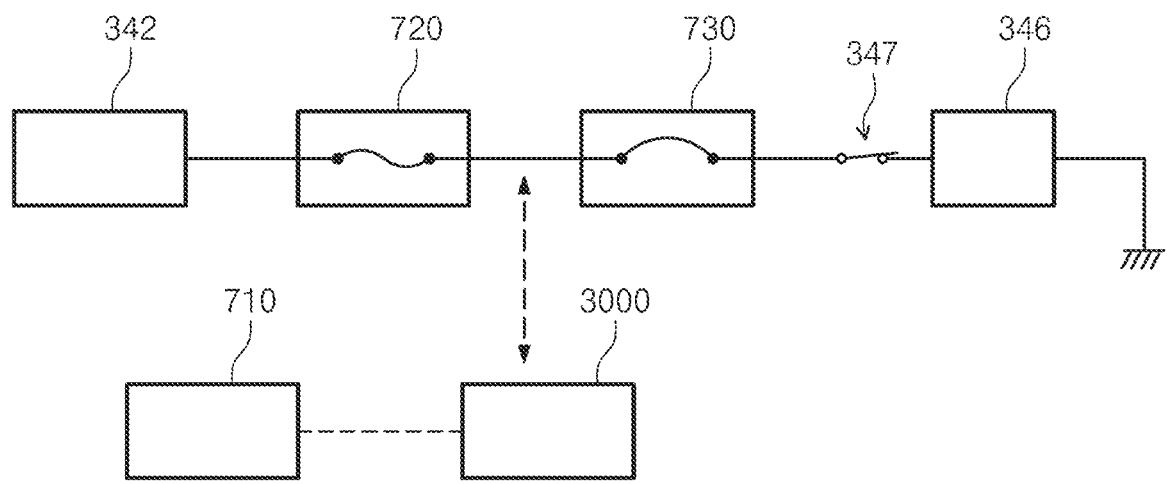
FIG. 11 is a block diagram schematically illustrating an example of electrical connection of a heating module and an interlock module of the inventive concept.

FIG. 11 is a block diagram schematically illustrating an example of electrical connection of a heating module and an interlock module of the inventive concept. Referring to FIG. 11, as described above, the heating member 342 generates heat that heats the substrate "W". The heating member 342 may be operated by the electric power applied by the power source 346. The power source 346 may apply the electric power to the heating member 342. The electric power applied by the power source 346 may be delivered from the power source line 344 to the heating member 342. It may be controlled whether the electric power is to be applied to the power source 346, by the switch 347 provided between the power source 346 and the heating member 342.

Figure 12:
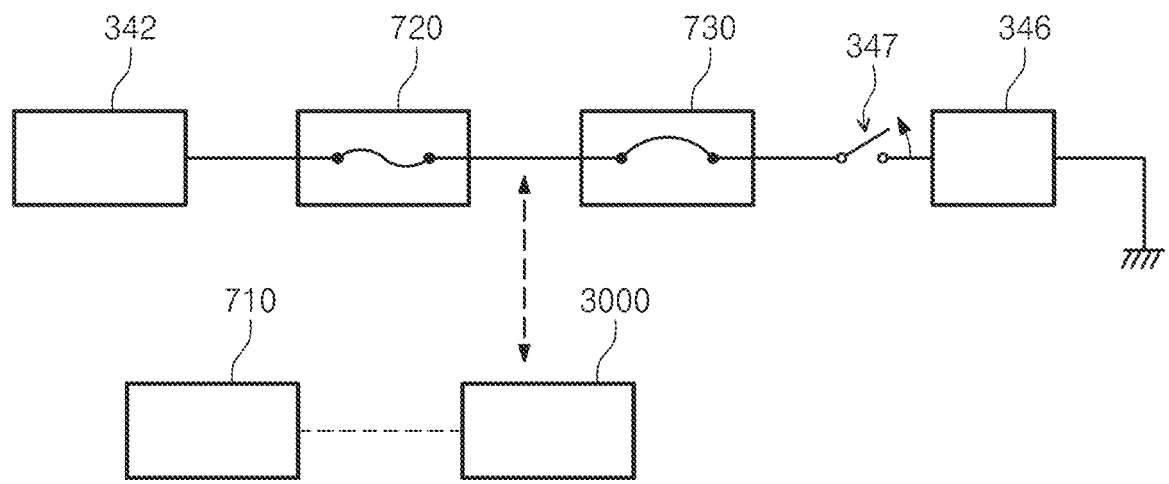
FIG. 12 is a view illustrating an example of performing an interlock by the interlock module of FIG. 11.

Furthermore, the first cutoff member 720 and the second cutoff member 730 may be electrically connected to each other in series. Furthermore, the temperature of the interior space 317, which is measured by the temperature sensor 710 may be delivered to the controller 3000. When the temperature of the interior space 317, which is received from the temperature sensor 710, is higher than the preset temperature that is stored in advance, the controller 3000 may generate a control signal for cutting off the electric power delivered from the power source line 344 to the heating member 342. For example, as illustrated in FIG. 12, the controller 3000 may generate a control signal for opening the switch 347.

Figure 13:
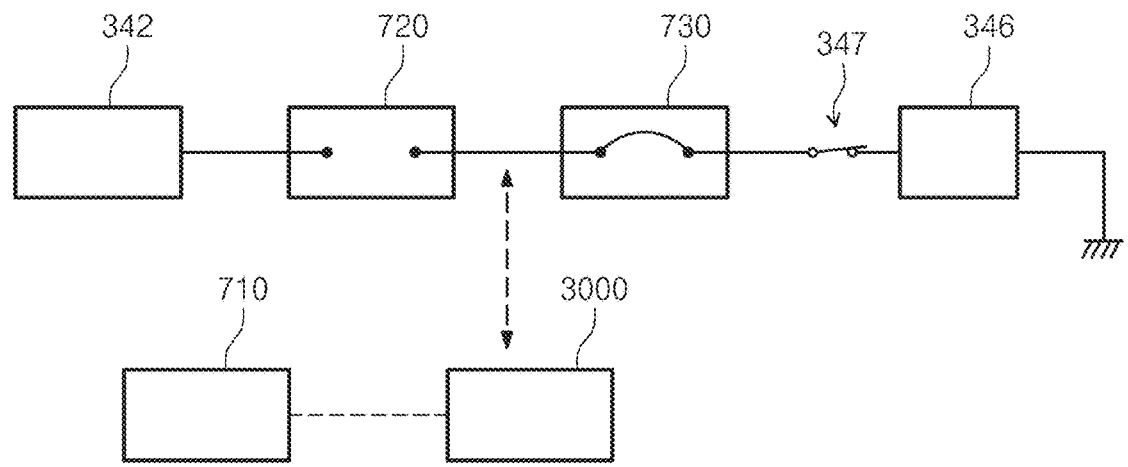
FIG. 13 is a view illustrating another example of performing an interlock by the interlock module of FIG. 11.

Furthermore, the fuse 722 of the first cutoff member 720 may have a specification of breaking the fuse line of the fuse 722 when the temperature of the interior space 317 is higher than the preset temperature. For example, when the temperature of the interior space 317 is higher than the preset temperature, as illustrated in FIG. 13, the fuse line of the fuse 722 may be broken. Accordingly, the electric power applied by the power source 346 to the heating member 342 may be cut off.

Figure 14:
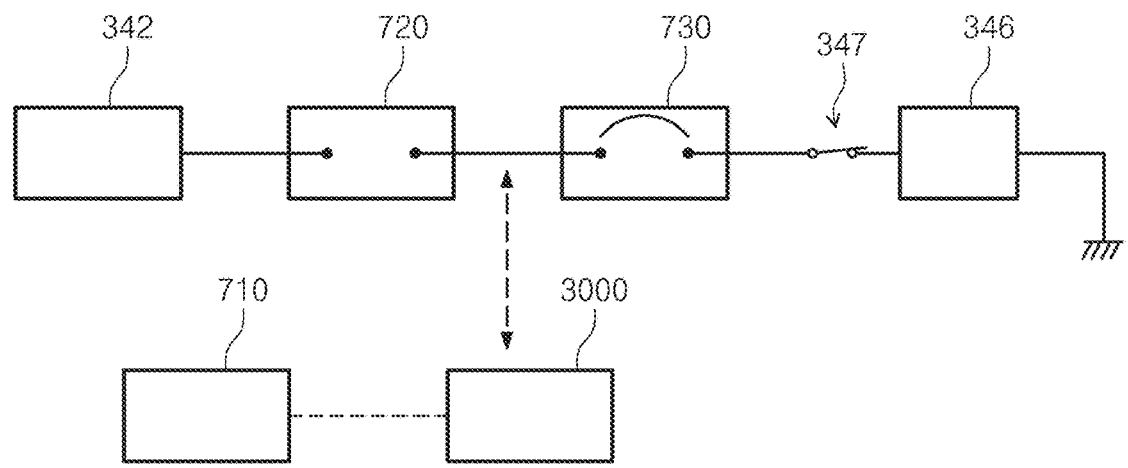
FIG. 14 is a view illustrating another example of performing an interlock by the interlock module of FIG. 11.

Similarly, the bimetal 732 of the second cutoff member 730 may have a specification of deforming the metal plates of the bimetal 732 when the temperature of the interior space 317 is higher than the preset temperature. For example, when the temperature of the interior space 317 is higher than the preset temperature, as illustrated in FIG. 14, the metal plates of the second cutoff member 730 may be thermally deformed. Accordingly, the electric power applied by the power source 346 may be cut off.

Furthermore, when an area, in which the opening 361 is not formed in the reflection plate 360 when viewed from a top, is a first area and an area, in which the opening 361 is formed in the interior space 317, is a second area, as described above, a temperature of the first area of the interior space 317 may be higher than a temperature of the second area of the interior space 317. However, because the first area and the second area are areas that are communicated with each other, they may be in a proportional relationship in temperature.

Furthermore, when the fuse 722 and the bimetal 732 perform an interlock, the two configurations may not be reused. Accordingly, in the present application, the interlock by the temperature sensor 710 may be performed at a temperature that is lower than the interlock conditions of the first cutoff member 720 and the second cutoff member 730. For example, a case, in which the fuse line of the fuse 722 positioned in the second area, as described above, is broken at about 160° C., may be a case, in which the temperature of the first area is about 660° C. Furthermore, a case, in which the bimetal 732 positioned in the second area is thermally deformed, may be a case, in which the temperature of the first area is about 680° C. As described above, when the fuse 722 and the bimetal 732 perform an interlock, the two configurations may not be reused. Accordingly, when the measured temperature of the temperature sensor 710 that measures the temperature of the first area reaches about 640° C., the controller 3000 may generate a control signal for cutting off the electric power that is to be delivered from the power source 346 to the heating member 342.

As described above, the interlock module 700 of the inventive concept has a triple power cutoff structure. First, the temperature sensor 710 of the interlock module 700 measures the temperature of the interior space 317 and delivers data on the measured temperature to the controller 3000, and the controller 3000 generates a control signal for preventing the electric power applied by the power source 346 from being applied to the heating member 342, based on this. Second, the first cutoff member 720 of the interlock module 700 has a power cutoff structure, in which the electric power applied by the power source 346 is delivered to the heating member 342 when the temperature of the interior space 317 is higher than the preset temperature. Third, the second cutoff member 730 of the interlock module 700 has a power cutoff structure, in which the electric power applied by the power source 346 is delivered to the heating member 342 when the temperature of the interior space 317 is higher than the preset temperature.

Furthermore, the first cutoff member 720 and the second cutoff member 730 may be electrically connected to each other in series, and they have different power cutoff structures. Accordingly, when the temperature of the interior space 317 becomes higher than the preset temperature and any one of them cuts off the electric power, the electric power generated by the power source 346 is not delivered to the heating member 342. That is, the inventive concept effectively detects an excessive rise of the temperature of the interior space 317 in spite of various environmental factors, stops operations of the heating members 342 when the temperature of the interior space 317 excessively increases to effectively improve a danger of explosion of the support unit 300, and a danger of breakdown of the spin driving part 320.

It has been described as an example that the interlock module 700 is applied to the support unit 300, but the inventive concept is not limited thereto. For example, the above-described interlock module 700 may be applied to various devices having a material that generates heat in the same or similar way.

It has been described as an example that the interlock module 700 is applied to the substrate treating apparatus 10 that performs a fluid treatment, but the inventive concept is not limited thereto. For example, the above-described interlock module 700 may be applied to a substrate treating apparatus that dries the substrate "W", a substrate treating apparatus that treats the substrate by using plasma, a substrate treating apparatus that forms a coating film on the substrate, and the like, in the same or similar way.

Although it has been described as an example that the controller 3000 controls the support unit 300, the fluid supply unit 400, and the like, the inventive concept is not limited thereto. For example, the support unit 300 may include the controller that controls the configurations of the support unit 300, and the controller of the support unit 300 may perform an interlock of cutting off the electric power delivered to the heating member 342 when the temperature of the interior space 317 becomes higher than the preset temperature in a manner that is the same as or similar to that of the above-described controller 3000.

According to an embodiment of the inventive concept, an abnormal operation of a heating member that heats the substrate or a breakdown of a component that operates the heating member may be detected.

Furthermore, according to an embodiment of the inventive concept, an excessive rise of a temperature of a space, in which the heating member is disposed, may be detected.

In addition, according to an embodiment of the inventive concept, a danger of explosion by heat generated by a heating member and/or a danger of breakdown of a spin driving part may be improved.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, the attached claims have to be construed to include other embodiments.

What is claimed is:

1. A support unit that supports a substrate, the support unit comprising:
    a chuck stage configured to rotate;
    a heating member above the chuck stage and the heating member configured to heat the substrate supported by the support unit;
    a power source configured to heat the substrate by applying an electric power to the heating member;
    a window above the chuck stage and the window defining an interior space, the interior space including the heating member; and
    an interlock module in the interior space of the chuck stage configured to stop heating the substrate by selectively cutting off the electric power applied to the heating member,
    wherein the interlock module includes:
    a cutoff member configured to cut off the electric power delivered from the power source to the heating member by opening a closed circuit provided by the power source and the heating member according to a change in a temperature of the interior space,
    wherein the support unit includes:
    a reflection plate below the heating member:
    a cooling plate below the reflection plate; and
    a support member overlapping an opening formed in the reflection plate when viewed from a top, and the support member above the cooling plate, and
    wherein the cutoff member is installed in the support member.

2. The support unit of claim 1, further comprising:
    a controller,
    wherein the interlock module includes:
    a temperature sensor configured to measure the temperature of the interior space and deliver a measured temperature of the interior space to the controller, and
    wherein the controller is configured to generate a control signal for cutting off the electric power applied to the heating member when the temperature of the interior space, which is delivered from the temperature sensor, is higher than a preset temperature.

3. The support unit of claim 1, wherein the cutoff member includes:
    a first cutoff member; and
    a second cutoff member connected to the first cutoff member in series, and the second cutoff member including a power cutoff structure that is different from that of the first cutoff member.

4. The support unit of claim 3, wherein the first cutoff member includes a fuse, and
    wherein the second cutoff member includes a bimetal.

5. The support unit of claim 1, further comprising
    a terminal member inserted into the opening formed in the reflection plate, and connected to a power source line that delivers the electric power to the heating member,
    wherein the heating member has a hook shape, and one end and an opposite end of the heating member are connected to the terminal member.

6. The support unit of claim 5, further comprising:
    a spin driving part coupled to the chuck stage and configured to rotate the chuck stage, and the spin driving part including a hollow; and
    a body inserted into the hollow of the spin driving part,
    wherein the reflection plate is coupled to the body to be independent from rotation of the chuck stage.

7. The support unit of claim 6, wherein a plurality of heating members are provided, and the plurality of heating members are configured to surround the body when viewed from the top.

8. The support unit of claim 1, wherein the cutoff member includes:
    a first cutoff member, and
    a second cutoff member connected to the first cutoff member in series, and the second cutoff member including a power cutoff structure that is different from that of the first cutoff member,
    the heating member includes
    a first end and a second end, and the first end and the second end of the heating member are connected to opposite ends of a terminal member, and
    the interlock module is on the terminal member, between the first end and the second end of the heating member.

9. A substrate treating apparatus comprising:
    a chamber having an interior processing space;
    a support unit configured to support and rotate a substrate in the interior processing space;
    a fluid supply unit supported by the support unit and configured to supply a treatment fluid to the substrate as the substrate rotates;
    a bowl having a treatment space for treating the substrate supported by the support unit; and
    a controller,
    wherein the support unit includes:
    a chuck stage coupled to a spin driving part having a hollow;
    a nozzle body inserted into the hollow of the spin driving part;

a heating member above the chuck stage and the heating member configured to heat the substrate supported by the support unit;

a reflection plate coupled to the nozzle body and below the heating member;

a cooling plate below the reflection plate;

a support member inserted into an opening formed in the reflection plate, the support member above the cooling plate;

a power source configured to heat the substrate by applying an electric power to the heating member;

a window above the chuck stage and the window defining an interior space, the interior space including the heating member; and an interlock module in the interior space of the chuck stage configured to stop heating the substrate by selectively cutting off the electric power delivered to the heating member when a temperature of the interior space is higher than a preset temperature, wherein the interlock module includes:

a temperature sensor configured to measure the temperature of the interior space and deliver a measured temperature of the interior space to the controller; or a cutoff member configured to stop heating the substrate by selectively cutting off the electric power delivered from the power source to the heating member by opening a closed circuit provided by the power source and the heating member according to a change in the temperature of the interior space, and wherein the cutoff member is installed in the support member.

10. The substrate treating apparatus of claim 9, wherein the controller is configured to generate a control signal for cutting off the electric power applied to the heating member when the temperature of the interior space, which is delivered from the temperature sensor, is higher than the preset temperature.

11. The substrate treating apparatus of claim 9, wherein the cutoff member includes:

a first cutoff member; and a second cutoff member having a power cutoff structure that is different from that of the first cutoff member.

12. The substrate treating apparatus of claim 11, wherein the first cutoff member includes a fuse, and wherein the second cutoff member includes a bimetal.

13. The substrate treating apparatus of claim 9, further comprising:

a terminal member inserted into the opening formed in the reflection plate, and connected to a power source line that delivers the electric power to the heating member, wherein the heating member has a hook shape, and one end and an opposite end of the heating member are connected to the terminal member.

14. The substrate treating apparatus of claim 9, wherein a plurality of heating members are provided, and the plurality of heating members are configured to surround the nozzle body when viewed from a top.

15. The substrate treating apparatus of claim 14, wherein the plurality of heating members are fixedly installed above the reflection plate to be independent from rotation of the chuck stage.

16. The substrate treating apparatus of claim 9, wherein the cutoff member includes:

a first cutoff member, and a second cutoff member connected to the first cutoff member in series, and the second cutoff member including a power cutoff structure that is different from that of the first cutoff member, the heating member includes a first end and a second end, and the first end and the second end of the heating member are connected to opposite ends of a terminal member, and the interlock module is on the terminal member, between the first end and the second end of the heating member.

* * * * *